(12) United States Patent
Little et al.

(10) Patent No.: US 9,905,944 B2
(45) Date of Patent: Feb. 27, 2018

(54) FLIPPABLE ELECTRICAL CONNECTOR

(71) Applicant: FOXCONN INTERCONNECT TECHNOLOGY LIMITED, Grand Cayman (KY)

(72) Inventors: Terrance F. Little, Fullerton, CA (US); Chih-Pi Cheng, New Taipei (TW)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 14/719,282

(22) Filed: May 21, 2015

(65) Prior Publication Data

US 2015/0255905 A1 Sep. 10, 2015

Related U.S. Application Data

(63) Continuation-in-part of application No. 14/558,732, filed on Dec. 3, 2014, now Pat. No. 9,490,594, which
(Continued)

(51) Int. Cl.
*H01R 12/00* (2006.01)
*H01R 9/03* (2006.01)
(Continued)

(52) U.S. Cl.
CPC ......... *H01R 9/038* (2013.01); *H01R 13/6585* (2013.01); *H01R 13/6658* (2013.01); *H01R 12/724* (2013.01); *H01R 24/60* (2013.01); *H01R 2107/00* (2013.01); *H05K 1/117* (2013.01); *H05K 1/184* (2013.01); *H05K 2201/09063* (2013.01); *H05K 2201/10189* (2013.01)

(58) Field of Classification Search
CPC ..... H01R 9/038; H01R 13/6658; H01R 24/62
USPC ..................................... 439/78, 55
See application file for complete search history.

(56) References Cited

U.S. PATENT DOCUMENTS 5,073,130 A 12/1991 Nakamura
6,755,689 B2 6/2004 Zhang et al.
(Continued)

FOREIGN PATENT DOCUMENTS

CN 1253402 A 5/2000
CN 2454802 Y 10/2001
(Continued)

OTHER PUBLICATIONS

Universal Serial Bus Type-C Cable and Connector Specification Revision 0.7 Working Draft Jan. xx, 2014, p. 13-14,20-21,33,38.
(Continued)

*Primary Examiner* — Abdullah Riyami
*Assistant Examiner* — Nader Alhawamdeh
(74) *Attorney, Agent, or Firm* — Wei Te Chung; Ming Chieh Chang

(57) ABSTRACT

A receptacle connection assembly includes a printed circuit board defining two spaced slots in a front edge portion with a mating tongue formed therebetween, a plurality of pads formed on two opposite surfaces of the mating tongue in a diagonally symmetrical manner for a flippable usage and a metallic shield including a tubular capsular portion assembled to the PCB to enclose the mating tongue.

20 Claims, 44 Drawing Sheets

Related U.S. Application Data is a continuation-in-part of application No. 14/542,550, filed on Nov. 15, 2014, now Pat. No. 9,350,126, and a continuation-in-part of application No. 14/497,205, filed on Sep. 25, 2014, now Pat. No. 9,472,910, application No. 14/719,282, which is a continuation-in-part of application No. 14/477,889, filed on Sep. 5, 2014, now Pat. No. 9,525,223, application No. 14/719,282, which is a continuation-in-part of application No. 14/454,737, filed on Aug. 8, 2014, now Pat. No. 9,525,227, application No. 14/719,282, which is a continuation-in-part of application No. 14/337,180, filed on Jul. 21, 2014, now Pat. No. 9,318,853, application No. 14/719,282, which is a continuation-in-part of application No. 14/517,941, filed on Oct. 20, 2014, now Pat. No. 9,496,662.

(60) Provisional application No. 62/035,472, filed on Aug. 10, 2014, provisional application No. 62/021,066, filed on Jul. 4, 2014, provisional application No. 61/940,815, filed on Feb. 17, 2014, provisional application No. 61/943,310, filed on Feb. 22, 2014, provisional application No. 61/949,232, filed on Mar. 6, 2014, provisional application No. 61/917,363, filed on Dec. 18, 2013, provisional application No. 61/926,270, filed on Jan. 11, 2014, provisional application No. 61/916,147, filed on Dec. 14, 2013, provisional application No. 61/919,681, filed on Dec. 20, 2013, provisional application No. 61/875,096, filed on Sep. 8, 2013, provisional application No. 61/863,896, filed on Aug. 8, 2013, provisional application No. 61/866,037, filed on Aug. 14, 2013, provisional application No. 61/867,584, filed on Aug. 19, 2013, provisional application No. 61/856,077, filed on Jul. 19, 2013, provisional application No. 61/857,687, filed on Jul. 23, 2013, provisional application No. 61/899,276, filed on Nov. 3, 2013.

(51) Int. Cl.
  H01R 13/66 (2006.01)
  H01R 13/6585 (2011.01)
  H01R 12/72 (2011.01)
  H01R 24/60 (2011.01)
  H01R 107/00 (2006.01)
  H05K 1/11 (2006.01)
  H05K 1/18 (2006.01)

(56) References Cited

U.S. PATENT DOCUMENTS

| | | | |
|---|---|---|---|
| 7,758,379 B2 | 7/2010 | Chen | |
| 8,087,944 B2 | 1/2012 | Kumamoto et al. | |
| 8,517,773 B2 | 8/2013 | Lee et al. | |
| 8,968,031 B2 | 3/2015 | Simmel et al. | |
| 9,281,642 B1* | 3/2016 | Tseng | H01R 24/60 |
| 9,385,484 B2* | 7/2016 | Chen | H01R 13/6582 |
| 9,496,653 B2* | 11/2016 | Little | H01R 12/724 |
| 2007/0049100 A1 | 3/2007 | Tsai | |
| 2008/0003881 A1 | 1/2008 | Wu | |
| 2009/0061695 A1* | 3/2009 | Ko | H01R 9/038 439/682 |
| 2009/0156027 A1 | 6/2009 | Chen | |
| 2010/0267261 A1 | 10/2010 | Lin | |
| 2013/0065442 A1* | 3/2013 | Nagata | H01R 13/5202 439/607.58 |
| 2013/0095702 A1 | 4/2013 | Golko et al. | |
| 2013/0183844 A1* | 7/2013 | Wang | H01R 24/68 439/271 |
| 2014/0024257 A1* | 1/2014 | Castillo | H01R 13/6585 439/607.05 |
| 2014/0113481 A1* | 4/2014 | Little | H01R 13/64 439/374 |
| 2014/0349514 A1* | 11/2014 | Yang | H01R 13/6581 439/487 |
| 2015/0044886 A1* | 2/2015 | Little | H01R 12/75 439/55 |
| 2015/0056839 A1 | 2/2015 | Zhang | |
| 2015/0162684 A1 | 6/2015 | Amini et al. | |
| 2015/0171562 A1 | 6/2015 | Gao et al. | |
| 2015/0214673 A1 | 7/2015 | Gao et al. | |
| 2015/0214674 A1 | 7/2015 | Simmel et al. | |
| 2015/0295362 A1 | 10/2015 | Tziviskos et al. | |
| 2015/0340813 A1 | 11/2015 | Ng et al. | |
| 2015/0340815 A1 | 11/2015 | Gao et al. | |
| 2015/0340825 A1 | 11/2015 | Ng et al. | |
| 2015/0372424 A1* | 12/2015 | Little | H01R 13/642 439/217 |
| 2016/0118752 A1 | 4/2016 | Guo et al. | |
| 2016/0164218 A1* | 6/2016 | Lee | H01R 13/5202 439/587 |

FOREIGN PATENT DOCUMENTS

| | | |
|---|---|---|
| CN | 2724249 Y | 9/2005 |
| CN | 2728006 Y | 9/2005 |
| CN | 2821921 Y | 9/2006 |
| CN | 201029143 Y | 2/2008 |
| CN | 201078847 Y | 6/2008 |
| CN | 201230066 Y | 4/2009 |
| CN | 101573840 A | 11/2009 |
| CN | 201498627 U | 6/2010 |
| CN | 201623280 U | 11/2010 |
| CN | 201708399 U | 1/2011 |
| CN | 201717435 U | 1/2011 |
| CN | 201741935 U | 2/2011 |
| CN | 201741937 U | 2/2011 |
| CN | 201868687 U | 6/2011 |
| CN | 102280732 B | 12/2011 |
| CN | 202076514 U | 12/2011 |
| CN | 102437482 A | 5/2012 |
| CN | 202217831 U | 5/2012 |
| CN | 202231226 U | 5/2012 |
| CN | 102544812 A | 7/2012 |
| CN | 202423735 | 9/2012 |
| CN | 202513384 U | 10/2012 |
| CN | 202737282 | 2/2013 |
| CN | 103081253 A | 5/2013 |
| CN | 203242848 U | 10/2013 |
| CN | 103401087 A | 11/2013 |
| CN | 103427263 A | 12/2013 |
| CN | 203326282 U | 12/2013 |
| CN | 103579820 A | 2/2014 |
| CN | 103647172 A | 3/2014 |
| CN | 203481540 U | 3/2014 |
| CN | 103762479 A | 4/2014 |
| CN | 203521683 | 4/2014 |
| CN | 104377509 A | 2/2015 |
| CN | 204243365 U | 4/2015 |
| CN | 204577669 U | 8/2015 |
| KR | 2020100004799 U | 5/2010 |
| TW | M288035 | 2/2006 |
| TW | M357077 | 5/2009 |
| TW | M391213 | 10/2010 |
| TW | M398256 | 2/2011 |
| TW | M398262 | 2/2011 |
| TW | I427870 | 6/2011 |
| TW | M414692 | 10/2011 |
| TW | M426911 | 4/2012 |
| TW | M443957 | 12/2012 |
| TW | M453995 | 5/2013 |
| TW | M454654 | 6/2013 |
| TW | M471688 | 2/2014 |
| TW | M475728 | 4/2014 |

(56) References Cited

FOREIGN PATENT DOCUMENTS

| | | |
|---|---|---|
| WO | WO2009147791 | 12/2009 |
| WO | WO2013/020359 | 2/2013 |

OTHER PUBLICATIONS

USB Type-C Specification 0.9c05—20140518, p. 24-44,47,53-64,84-86.
Universal Serial Bus Type-C Cable and Connector Specification Revision 1.0 Aug. 11, 2014, p. 18-19,28-48,51,55,58,59-63,65-67,70,93,96-99.

* cited by examiner

400

FLIPPABLE ELECTRICAL CONNECTOR

CROSS REFERENCE TO RELATED APPLICATIONS

This application is a continuation-in-part of the co-pending application Ser. No. 14/558,732 filed Dec. 3, 2014 and the instant application further claims the benefit of, and priority to, U.S. Provisional Patent Application No. 62/021,066, filed Jul. 4, 2014, and No. 62/035,472 filed Aug. 10, 2014, the contents of which are incorporated entirely herein by reference.

BACKGROUND OF THE INVENTION

1. Field of the Invention

The present invention relates to an electrical connector, and more particularly to a flippable plug connector used with a receptacle connector.

2. Description of Related Art

In the previously filed provisional applications, the plug connector is "flippable" whereas we turn the plug over and it functions the same top and bottom. In order to be able to handle switching of the super speed signaling, a MUX (or SS switch) is built into the silicon. This can be costly and also cause some additional degredation in the super speed signals. Recently, a proposal for use with the future USB (Universal Serial Bus) was presented.

Hence, a new and simple electrical plug connector and the complementary receptacle connector are desired to improve those disclosed in the aforementioned proposal.

SUMMARY OF THE INVENTION

Accordingly, the object of the present invention is to provide a receptacle connection assembly, the assembly comprises a printed circuit board defining two spaced slots in a front edge portion with a mating tongue formed therebetween, a plurality of pads formed on two opposite surfaces of the mating tongue in a diagonally symmetrical manner for a flippable usage and a metallic shield including a tubular capsular portion assembled to the PCB to enclose the mating tongue. Alternately, the printed circuit board and the pads thereon may be replaced with the insulative housing and the corresponding contacts while instead of having the contacts mounted to a mother board, a plurality of micro-axial wires are soldered to the corresponding contacts, respectively.

Other objects, advantages and novel features of the invention will become more apparent from the following detailed description when taken in conjunction with the accompanying drawings.

DETAILED DESCRIPTION OF THE PREFERRED EMBODIMENT

Figure 1:
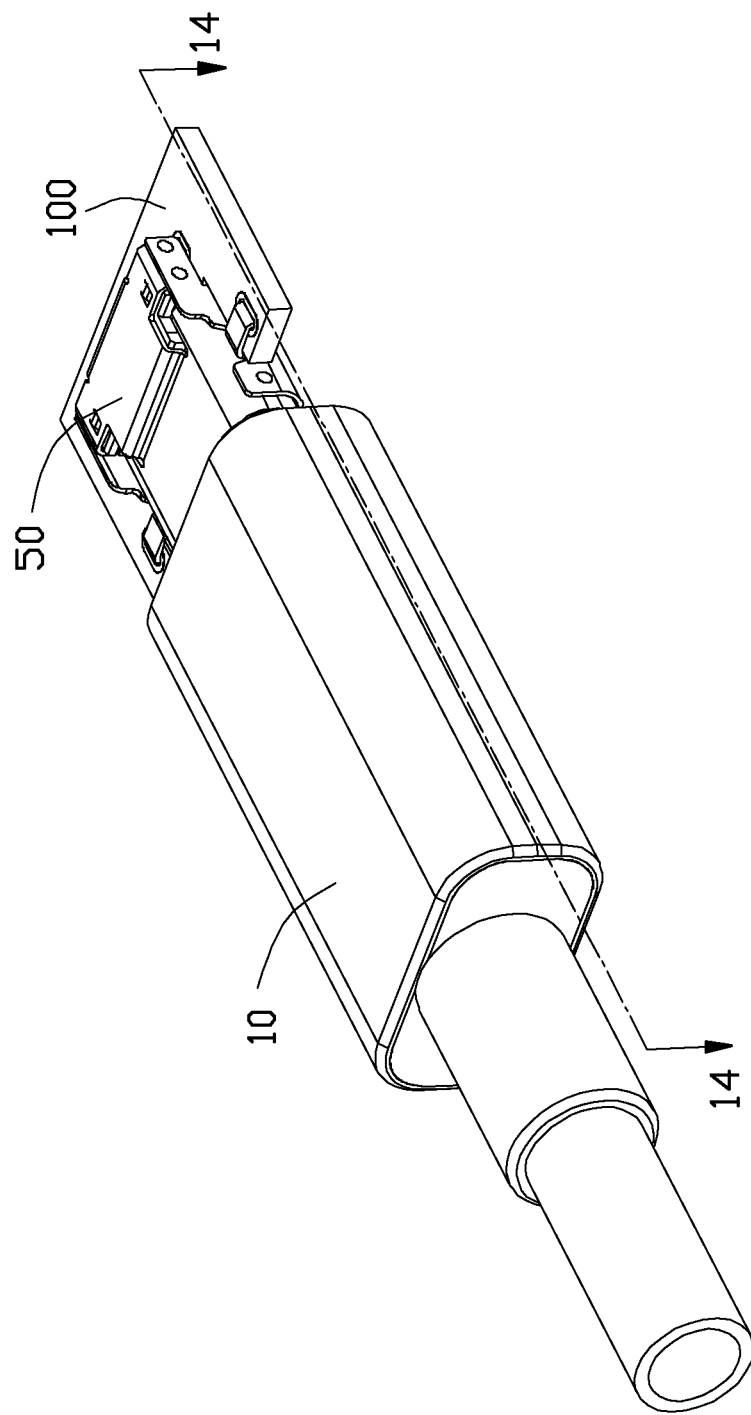
FIG. 1 is an assembled perspective view of the mated receptacle connector on the printed circuit board and the plug connector of the instant invention.
Figure 2A:
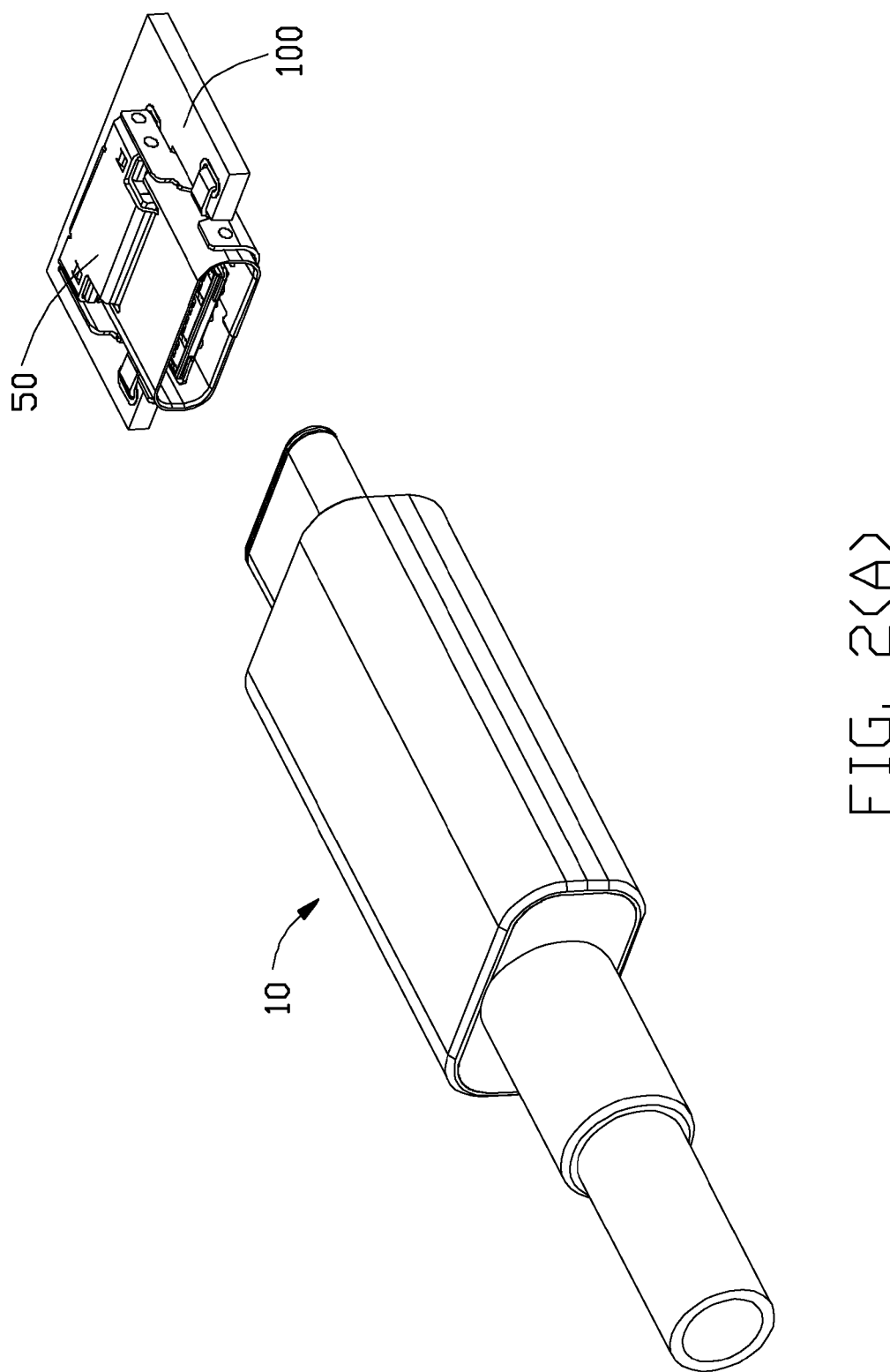
FIG. 2(A) is a front exploded perspective view of the receptacle connector and the plug connector of FIG. 1.
Figure 2B:
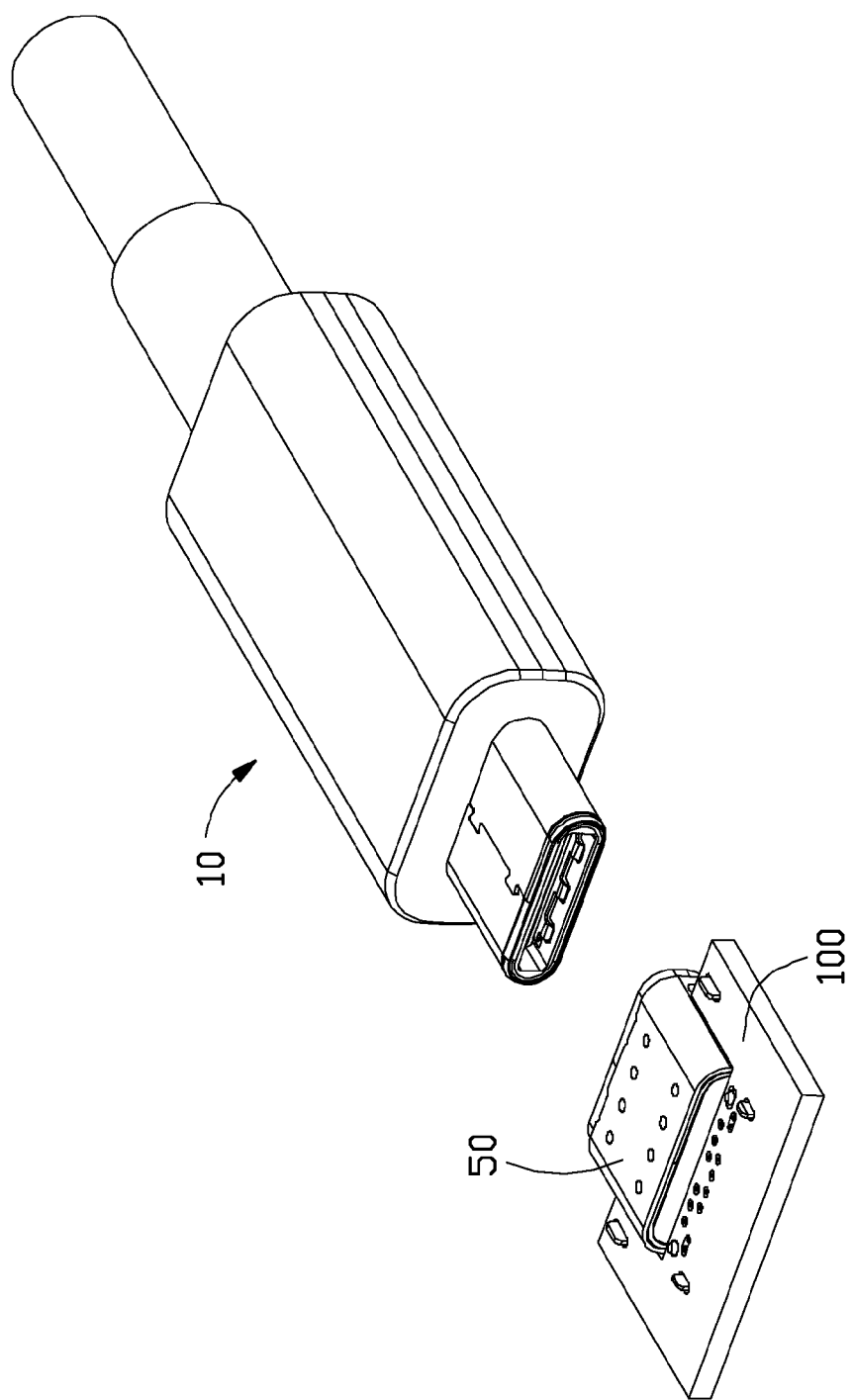
FIG. 2(B) is a rear exploded perspective view of the receptacle connector and the plug connector of FIG. 1.
Figure 3:
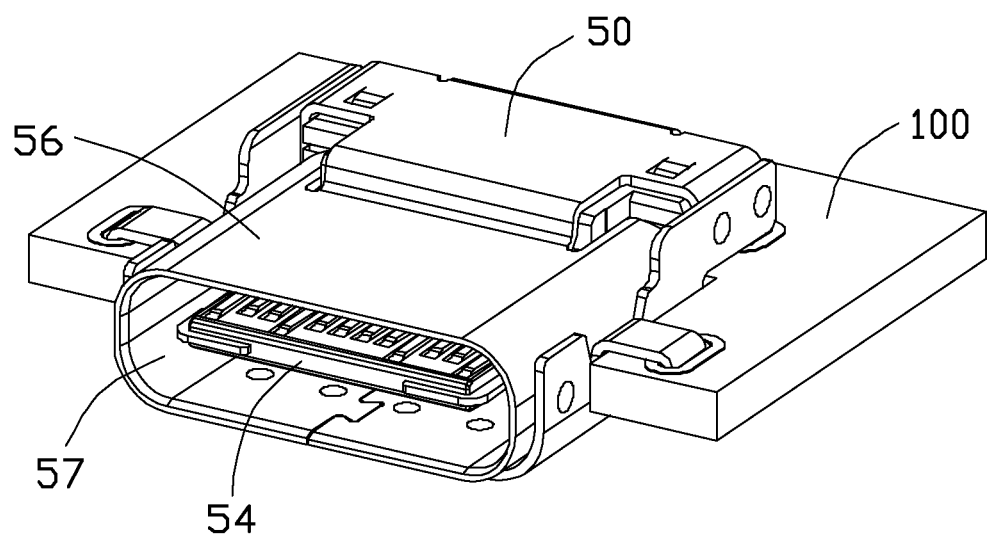
FIG. 3 is a front perspective view of the receptacle connector on the printed circuit board of FIG. 1.
Figure 4:
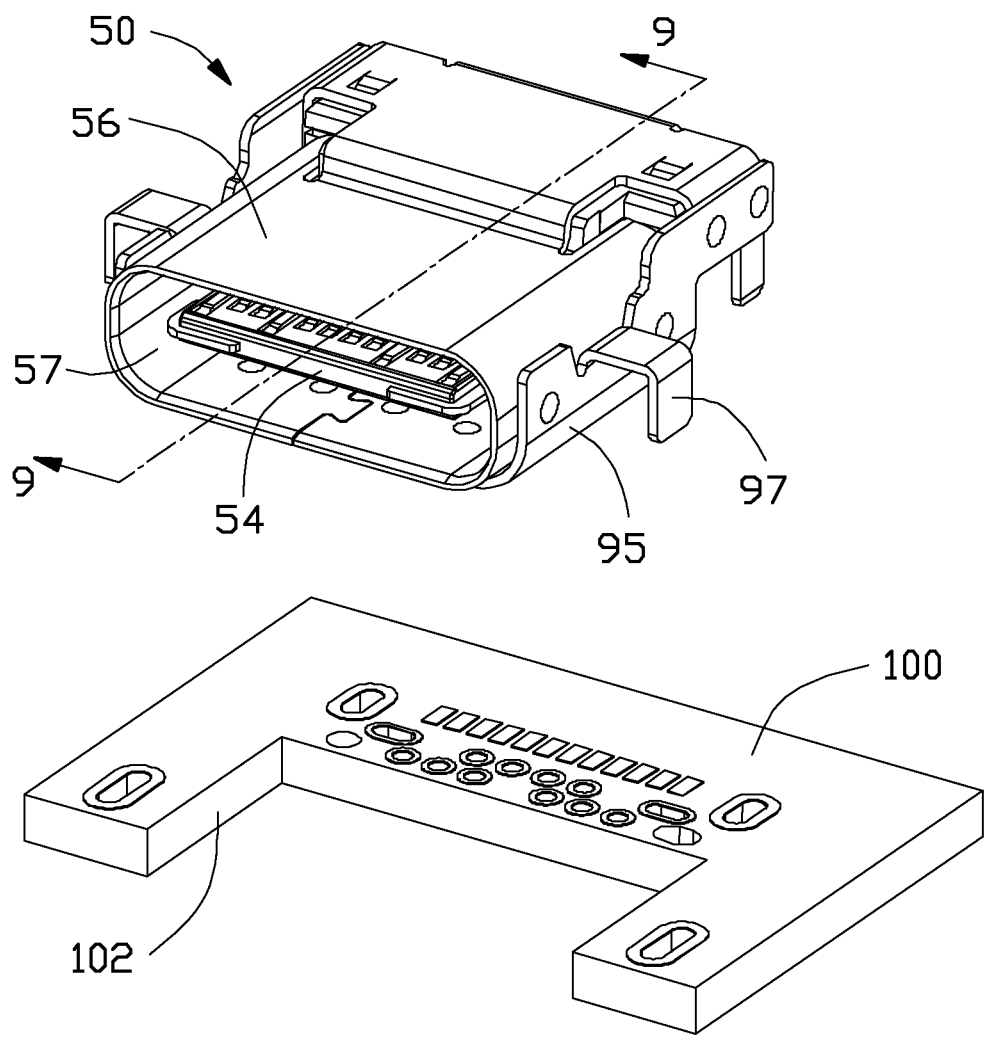
FIG. 4 is a front perspective view of the receptacle connector spaced from the printed circuit board of FIG. 1.
Figure 5A:
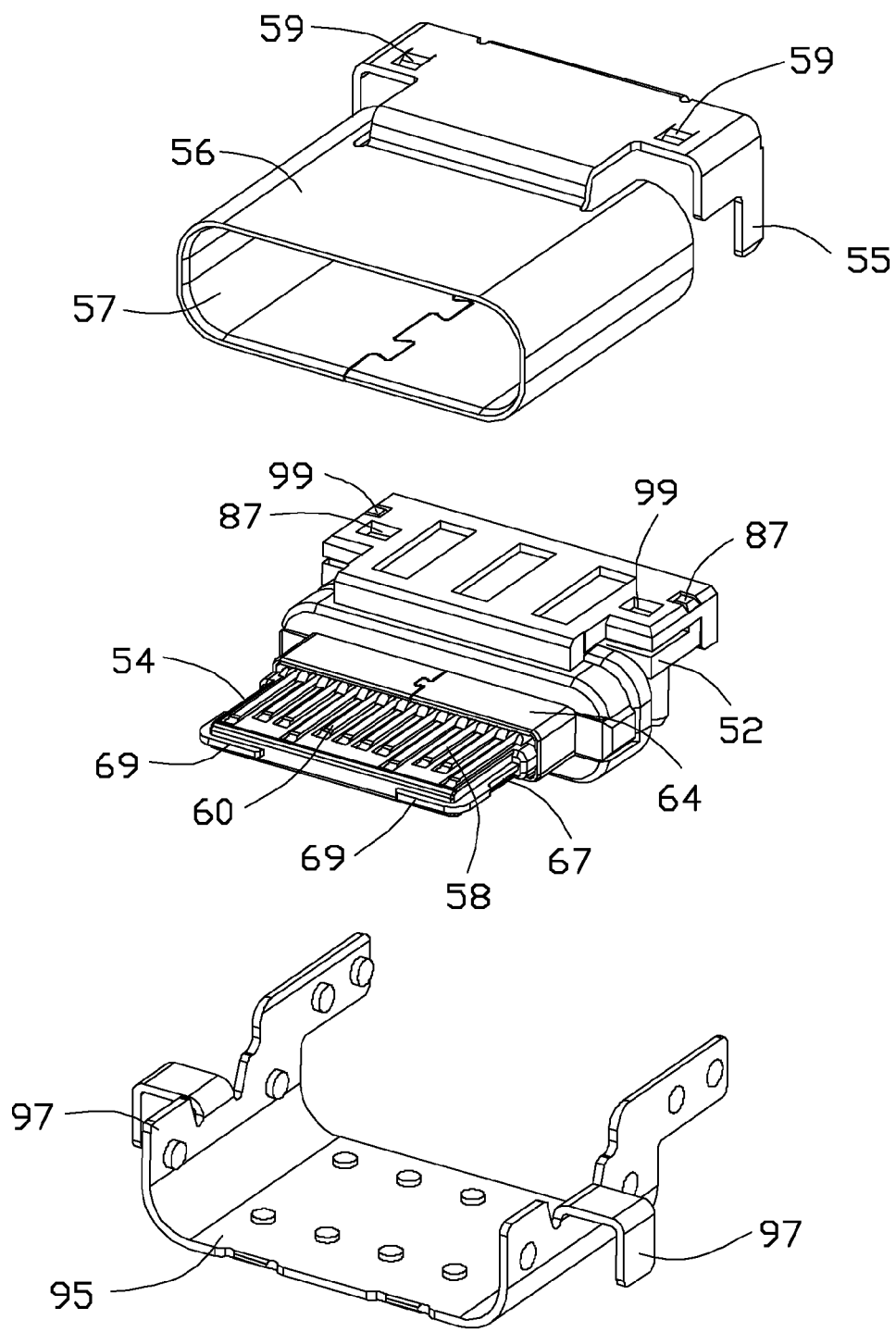
FIG. 5(A) is a front partially exploded perspective view of the receptacle connector of FIG. 1.
Figure 5B:
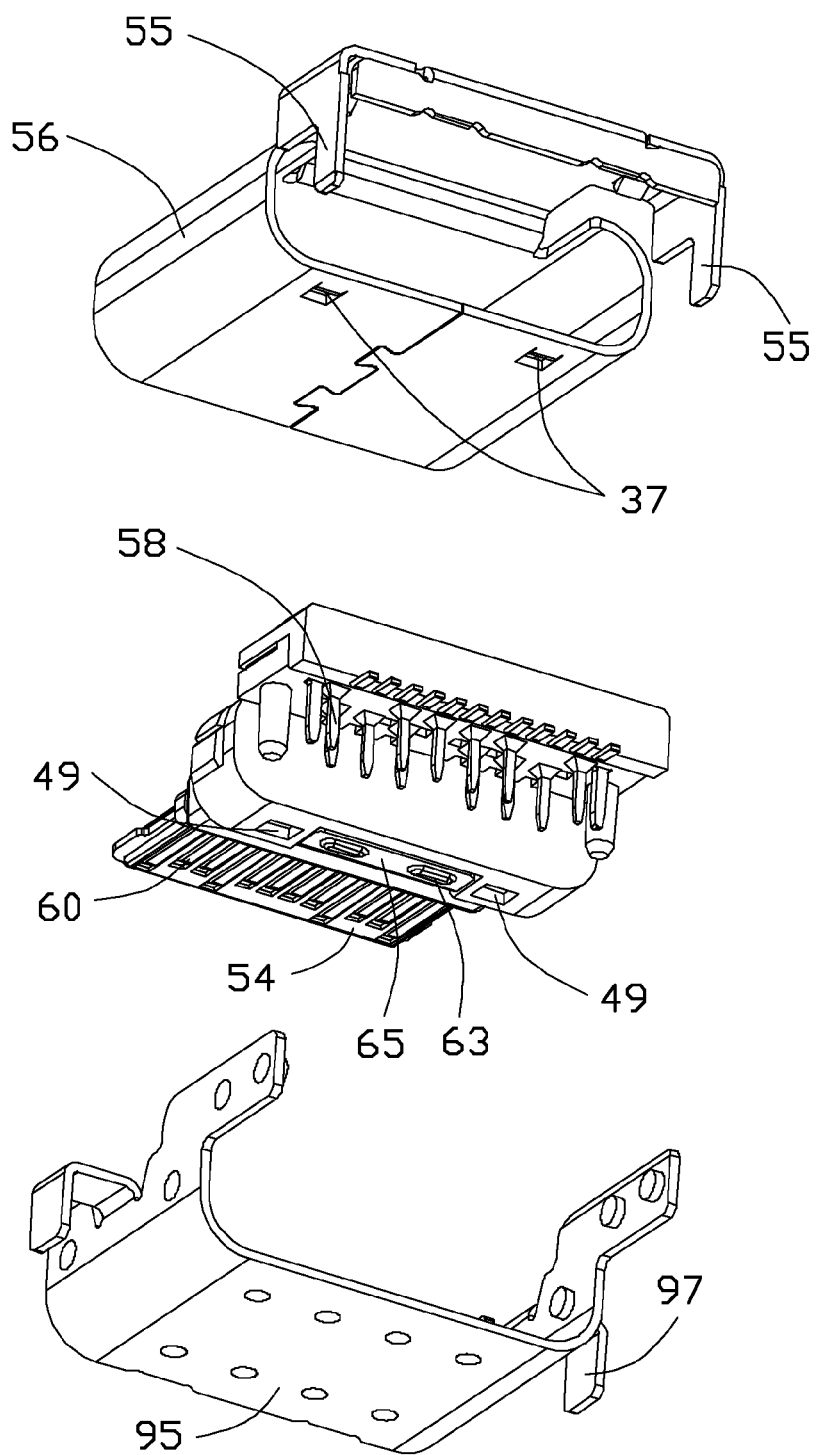
FIG. 5(B) is a rear partially exploded perspective view of the receptacle connector of FIG. 1.
Figure 6:
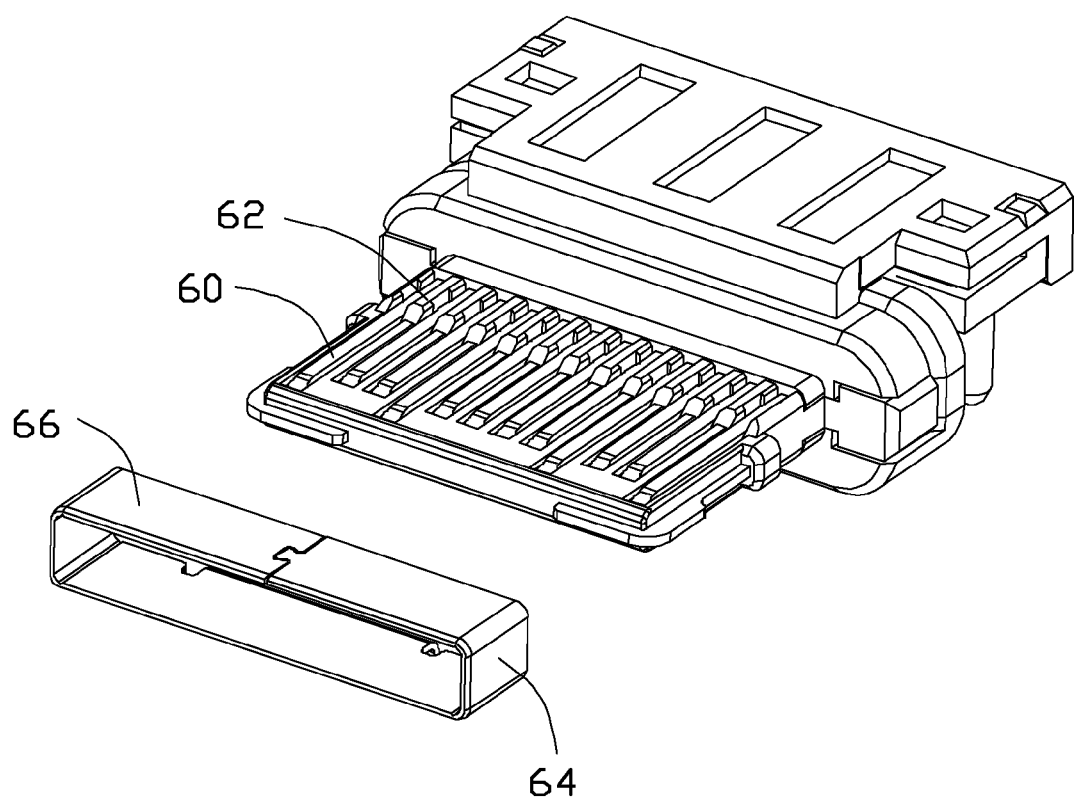
FIG. 6 is a front partially exploded perspective view of the receptacle connector of FIG. 1 without the shield thereof.
Figure 7A:
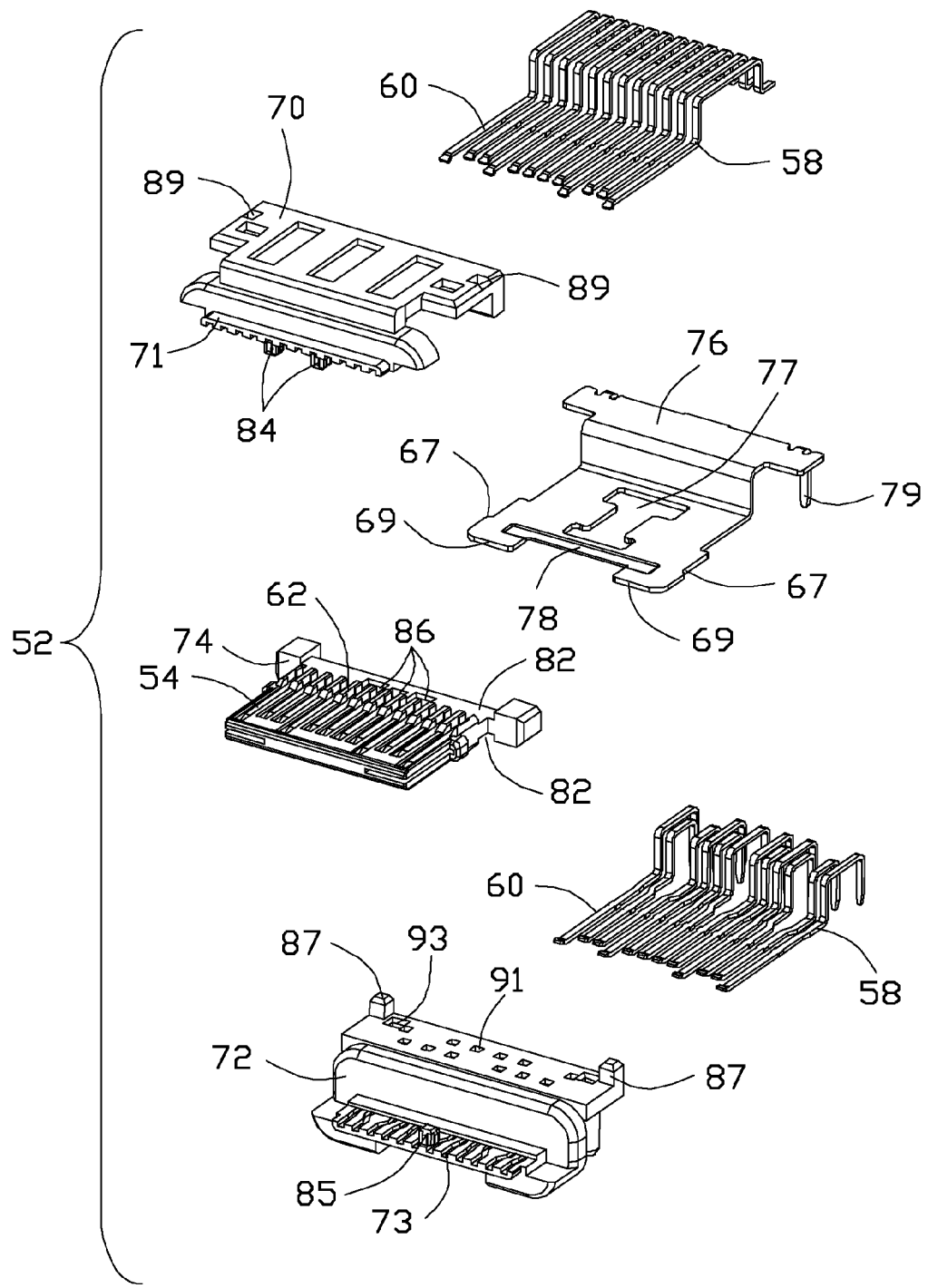
FIG. 7(A) is a front partially exploded perspective view of the receptacle connector of FIG. 1 to show the housing and the contacts thereof.
Figure 7B:
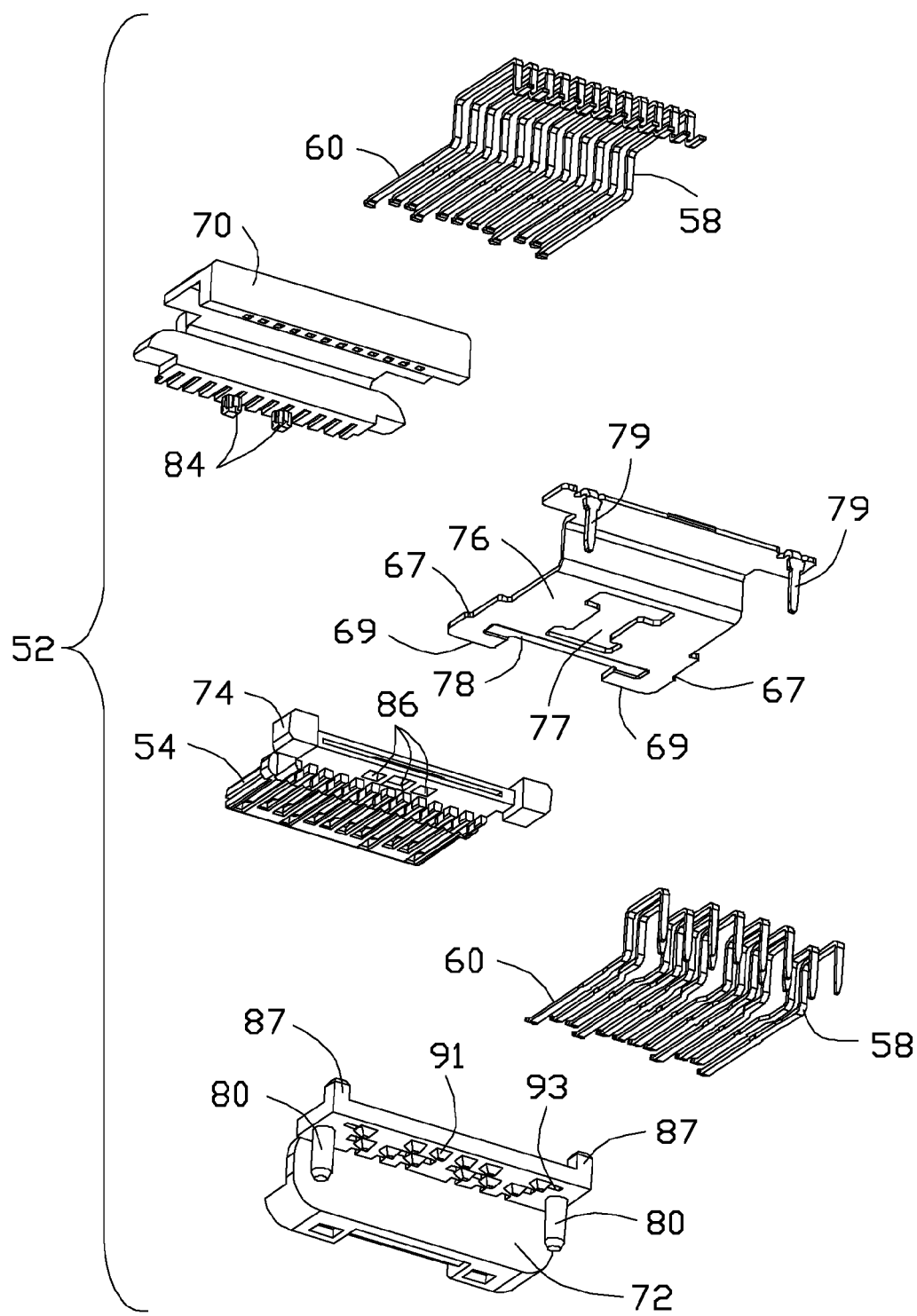
FIG. 7(B) is a rear partially exploded perspective view of the receptacle connector of FIG. 1 to show the housing and the contacts thereof.
Figure 8A:
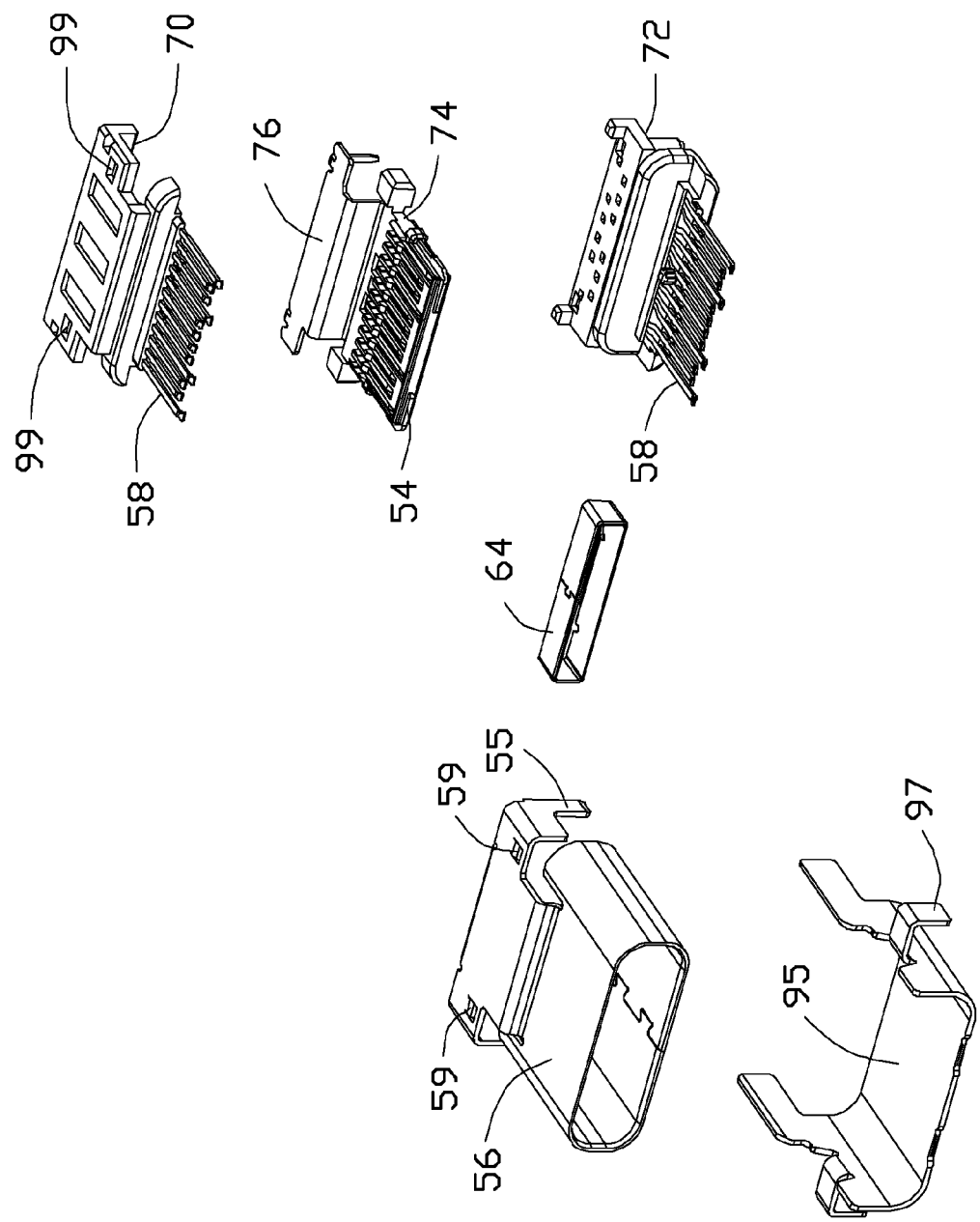
FIG. 8(A) is a front partially exploded perspective view of the receptacle connector of FIG. 1 wherein the housing and the contacts are pre-assembled together.
Figure 8B:
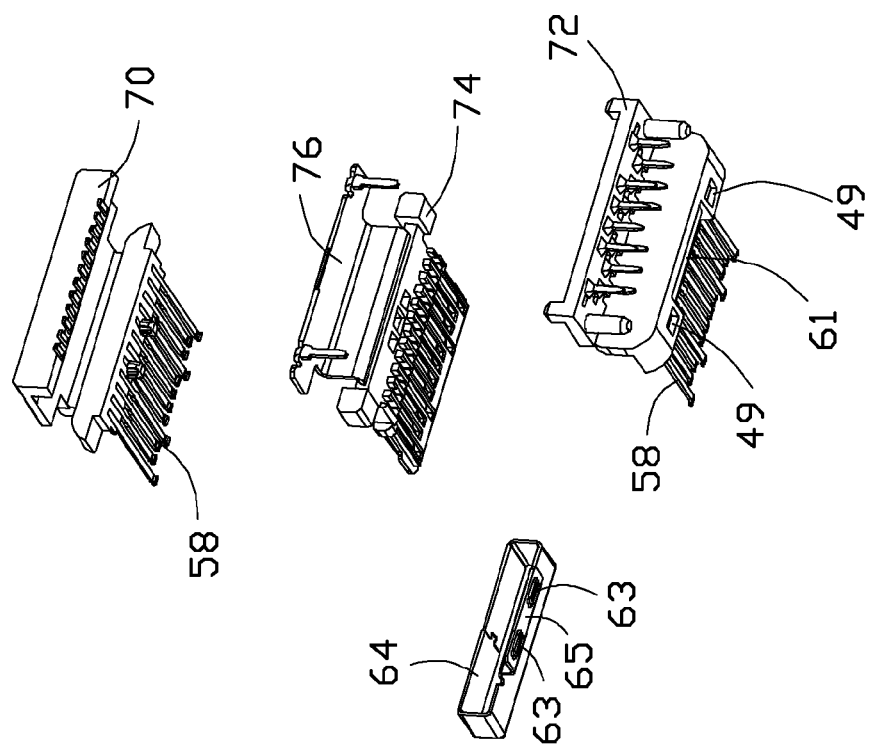
FIG. 8(B) is a rear partially exploded perspective view of the receptacle connector of FIG. 1 wherein the housing and the contacts are pre-assembled together.
Figure 8B:
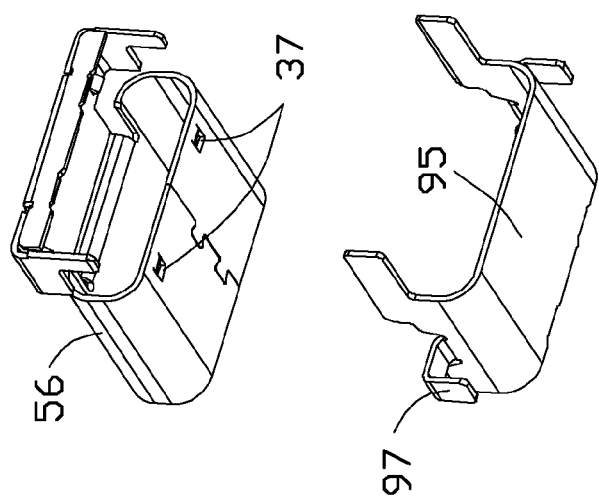
Figure 9:
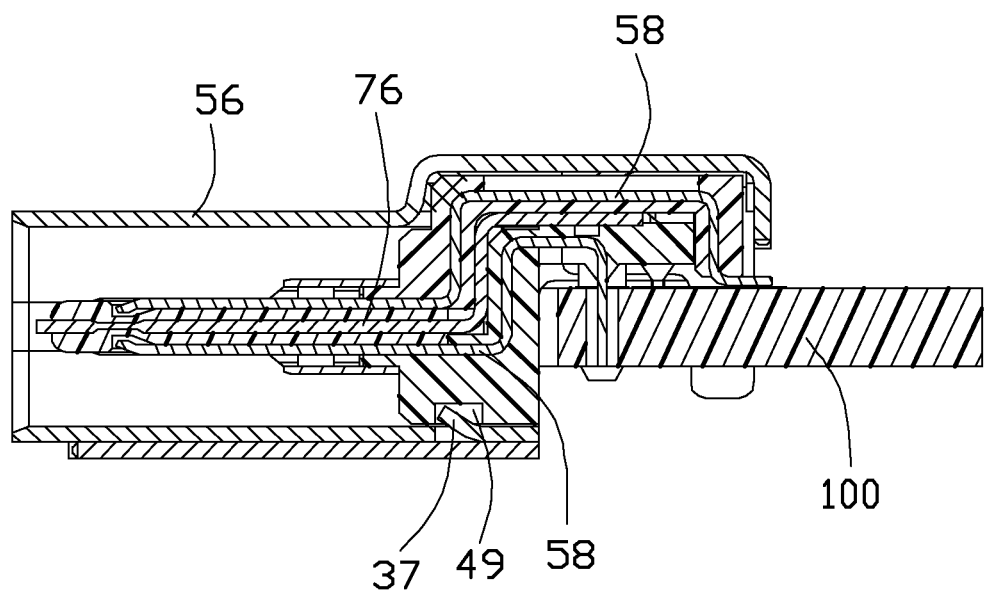
FIG. 9 is a cross-sectional view of the receptacle connector on the printed circuit board of FIG. 1 to show the retention tang of the shield.
Figure 9A:
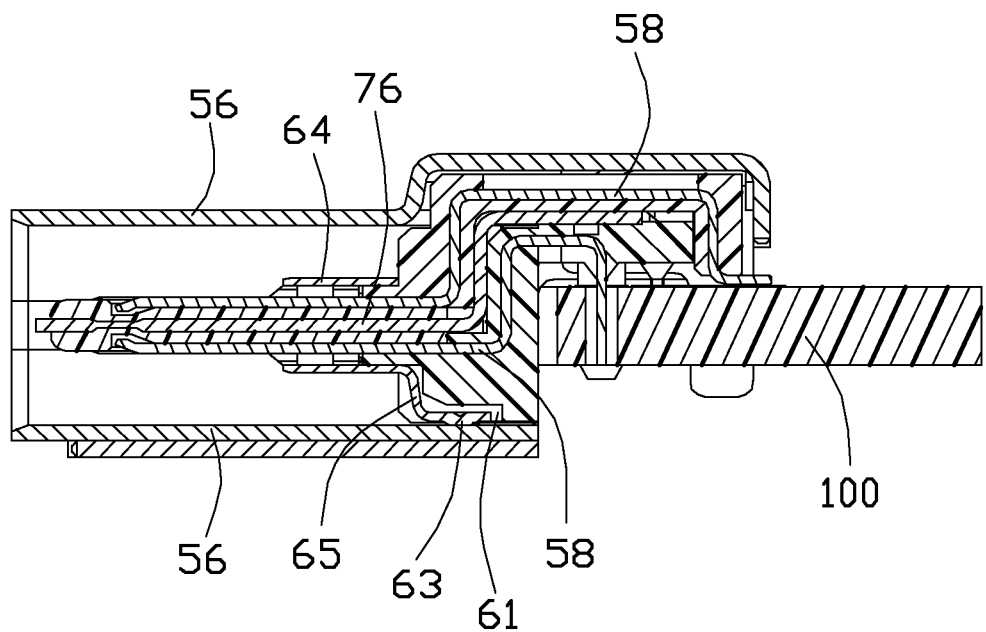
FIG. 9(A) is a cross-sectional view of the receptacle connector to show the extending plate of the collar.
Figure 10:
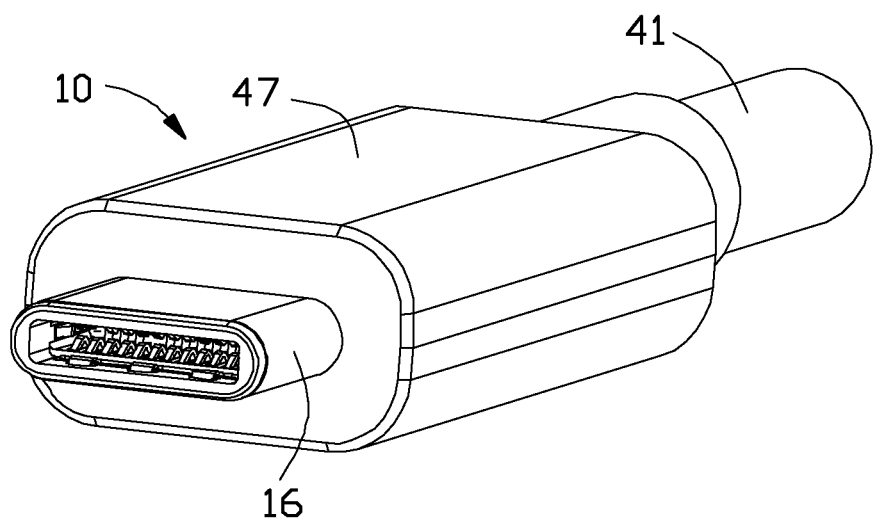
FIG. 10 is a front assembled perspective view of the plug connector of FIG. 1.
Figure 11A:
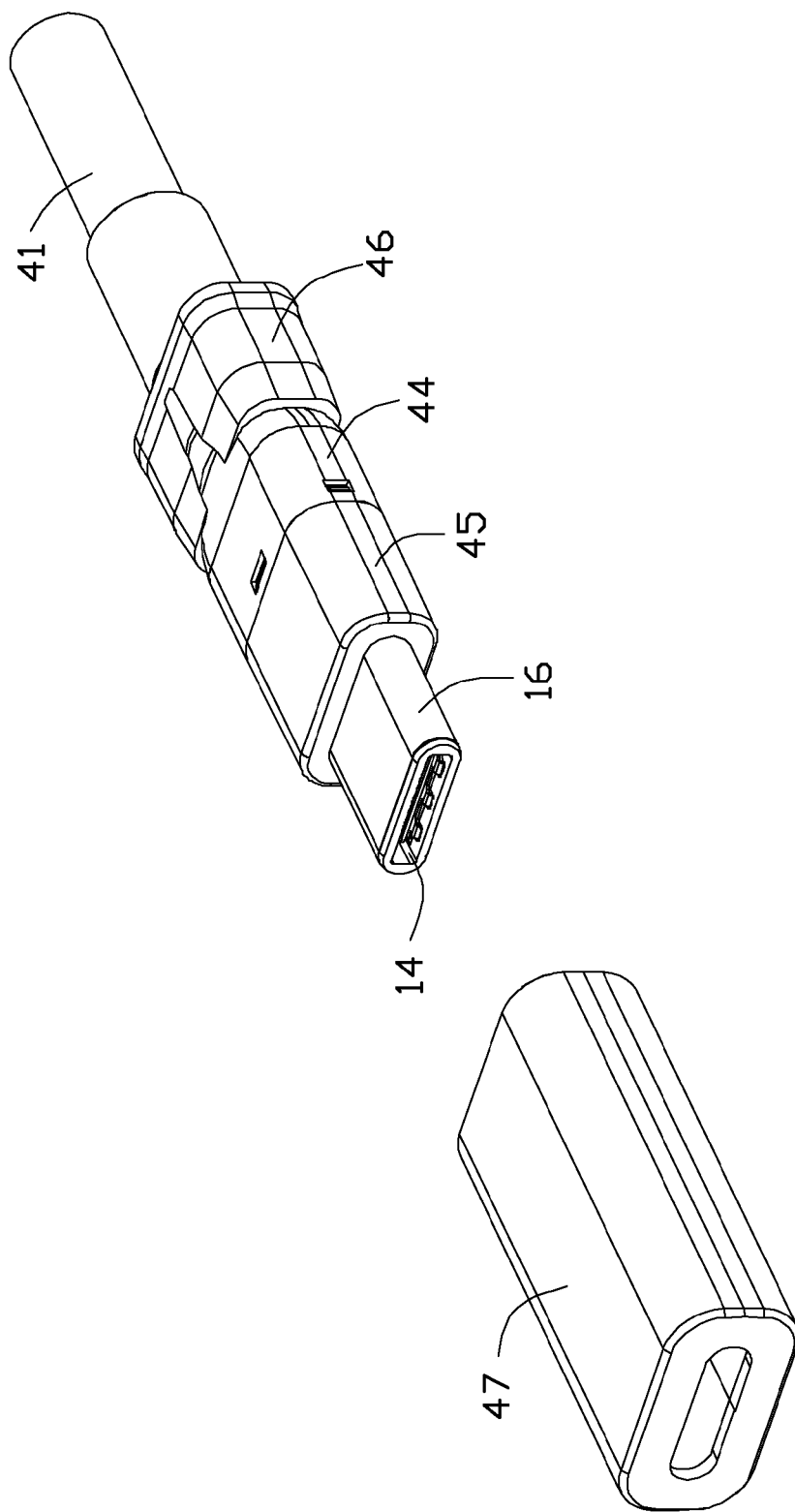
FIG. 11(A) is a front partially exploded perspective view of the plug connector of FIG. 1 wherein the cover is removed away from the remainder.
Figure 11B:
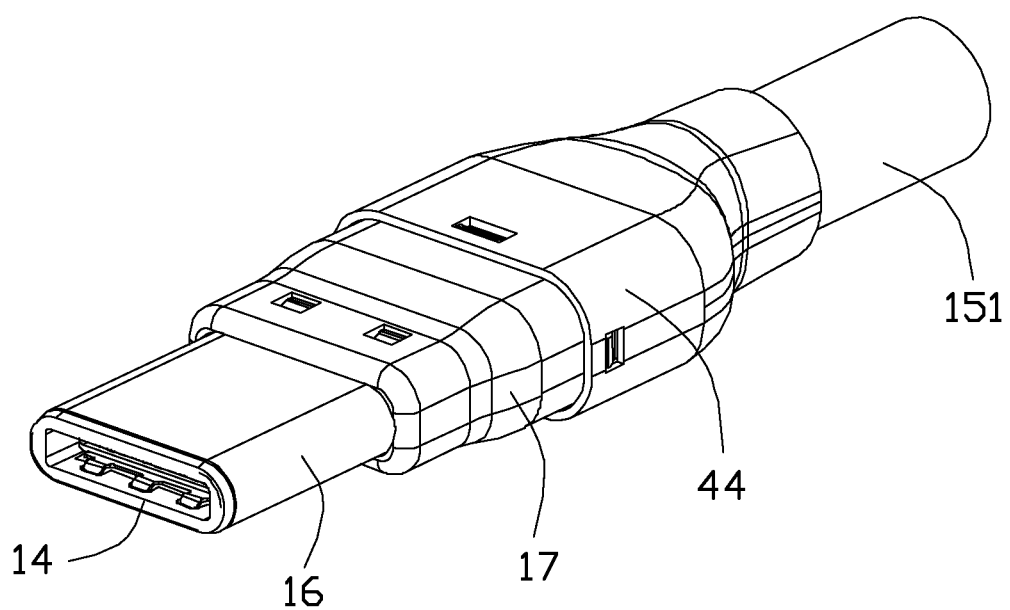
FIG. 11(B) is a front partially exploded perspective view of the plug connector of FIG. 11(A) wherein the front and rear over-moldings have been further removed.
Figure 12A:
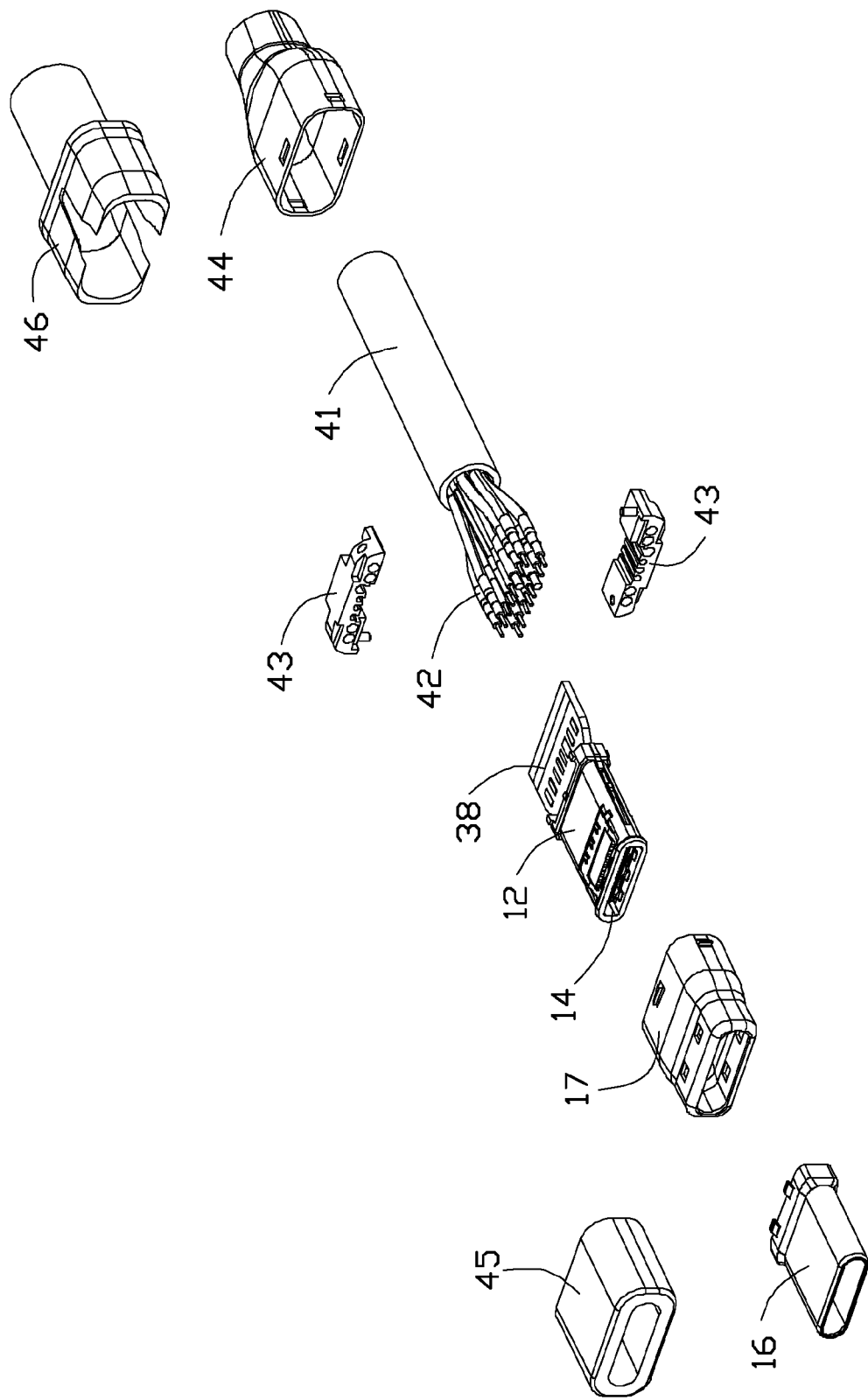
FIG. 12(A) is a front partially exploded perspective view of the plug connector of FIG. 1 without the cover thereof.
Figure 12B:
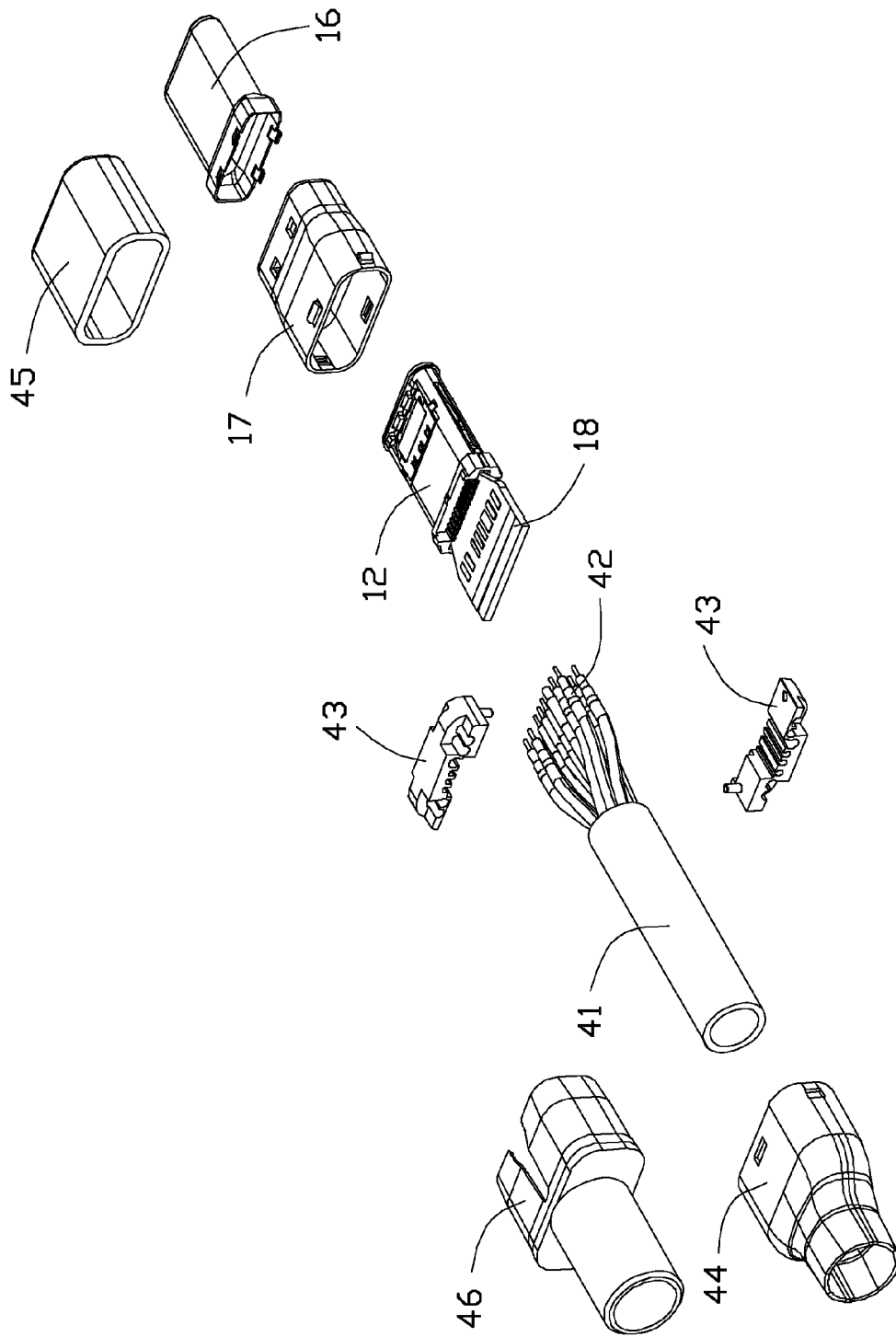
FIG. 12(B) is a rear partially exploded perspective view of the plug connector of FIG. 12(A).
Figure 13A:
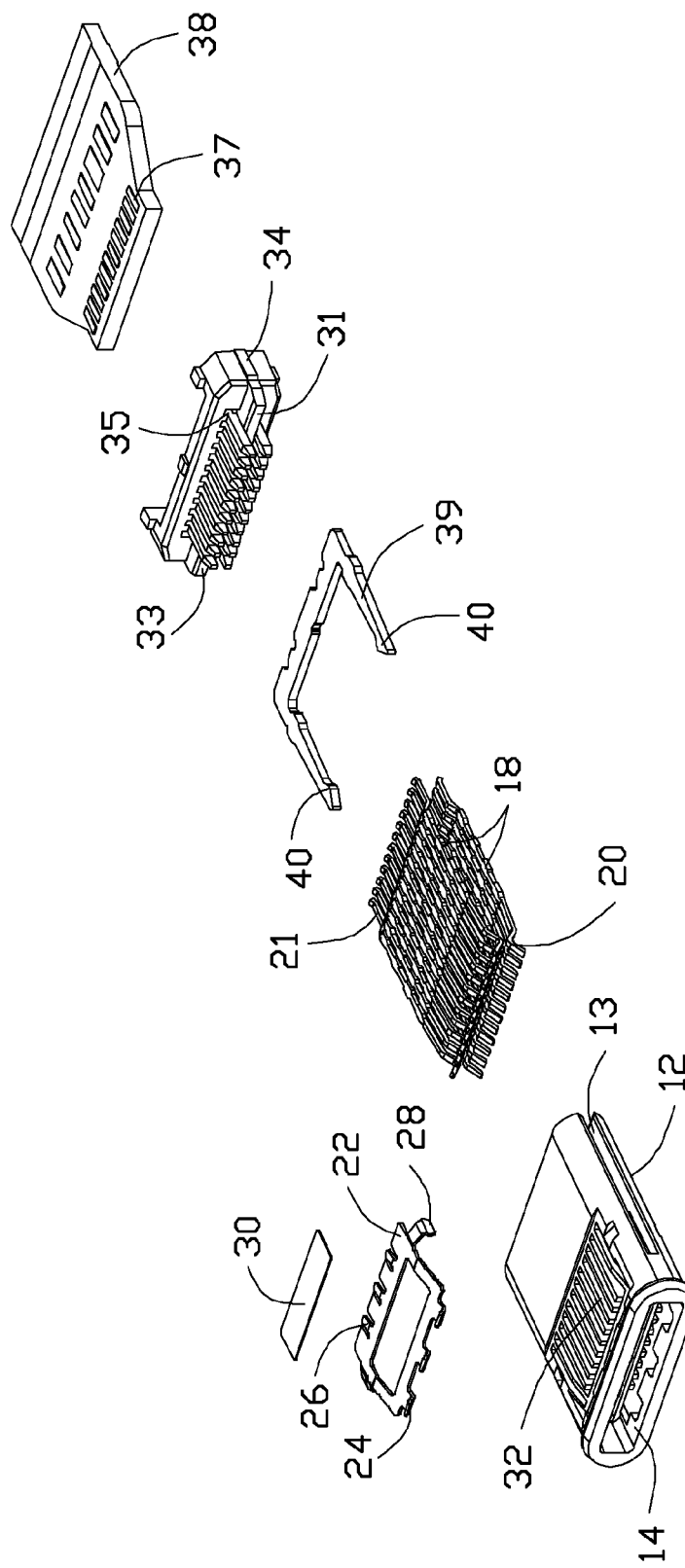
FIG. 13(A) is a front partially exploded perspective view of the plug connector of FIG. 12(A) by removal of additional parts therefrom.
Figure 13B:
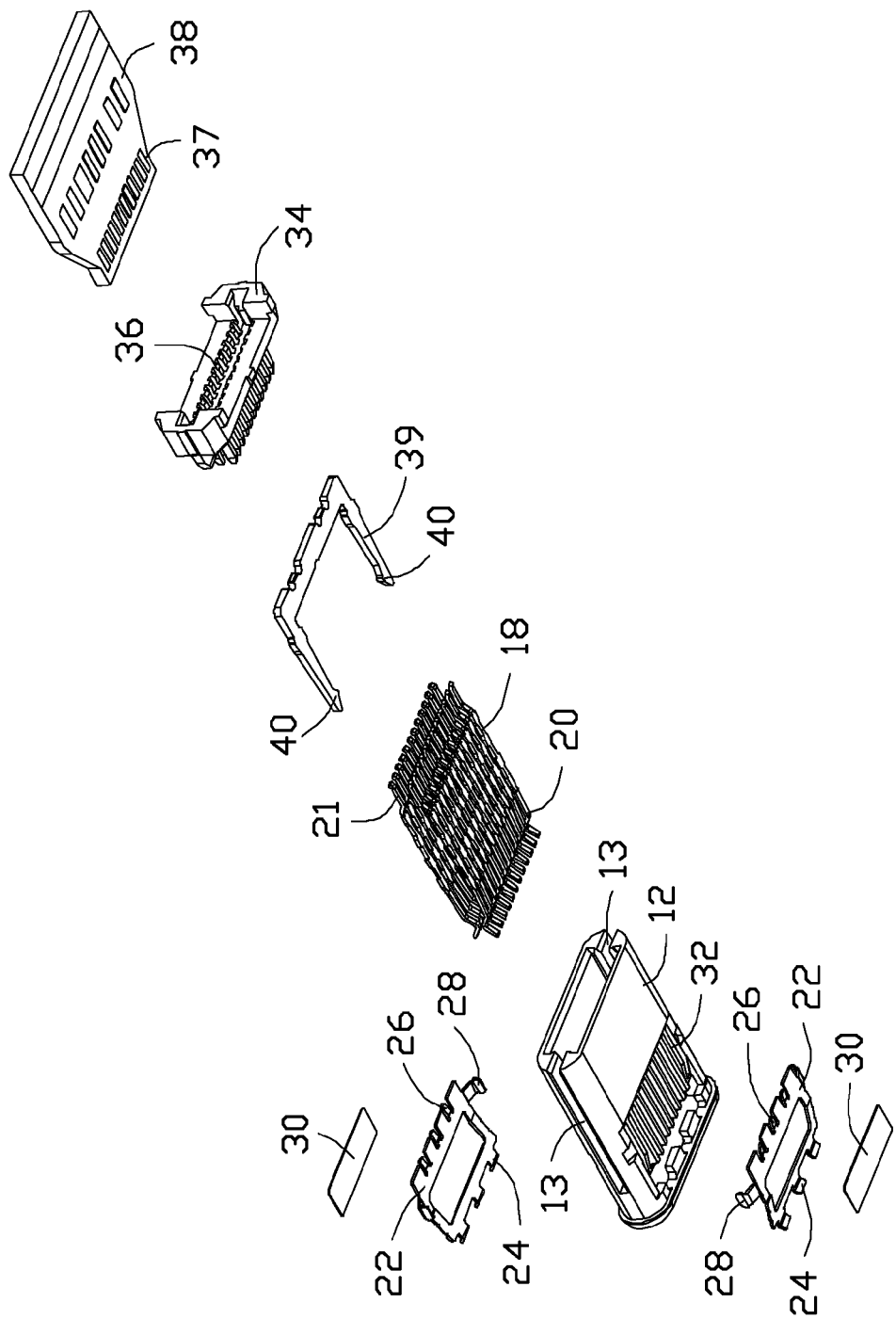
FIG. 13(B) is a rear partially exploded perspective view of the plug connector of FIG. 13(A).

Reference will now be made in detail to preferred embodiments of the present invention. FIGS. 1-2(B) show a plug connector 10 mated with a receptacle connector 50 mounted in a notch 102 of a printed circuit board 100 of a first embodiment. Referring to FIGS. 3-9, the receptacle connector 50 includes an insulative housing 52 with a mating tongue 54 forwardly extending in a capsular mating cavity 57 of a metallic shield 56 which encloses the housing 52. Opposite upper and lower rows of contacts 58 are disposed in the housing 52 with corresponding contacting sections 60 exposed upon opposite surfaces of the mating tongue 54 in a diagonally symmetrical arrangement mechanically and electrically so as to allow a so-called flappable insertion of the plug connector 10 thereinto. A step structure 62 is formed around a root of the mating tongue 54. A one piece metallic EMI collar 64 includes a loop structure 66 intimately surrounding the step structure 62. The collar 64 further includes an L-shaped extending plate 65 equipped with embossments 63 thereon and received in the recess 61 of the lower piece 72 of the housing 52 (illustrated later) for mechanically and electrically connecting to the shield 56.

The housing 52 is composed of the upper piece 70 and a lower piece 72 commonly sandwiching therebetween a middle piece 74 which forms the mating tongue 54. The upper row contacts 58 are associated with the upper piece 70, the lower row contacts 58 are associated with a lower piece 72 and the shielding plate 76 is associated with the middle piece 74 via an insert molding process wherein the contacting sections 60 of the upper row contacts 58 and those of the lower rows contacts 58 are seated upon opposite upper surface and lower surface of the mating tongue 54, respectively, as mentioned before. Understandably, the housing 52 and the associated contacts 58 may be deemed wholly as a so-called terminal module implying the terminals being integrally formed within an insulator. A rear portion of the step structure 62 is removed to have a front edge region 71 of the upper piece 70 and the front edge region 73 of the lower piece 72 sandwiched between the middle piece 74 and the loop structure 66 of the EMI collar 64 so as to enhance the strength during mating under some bending. In this embodiment, the shielding plate 76 defines an opening 77 and a thinner area 78 for both securing and impedance consideration, and further a pair of mounting legs 79 so as to efficiently separate the upper row contacts 58 and the lower row contacts 58 from each other wherein the upper row contacts 58 form the surface mount type tail sections while the lower row contacts 58 form the through hole type tail sections. In an alternate embodiment, the thinner area 78 may be totally removed from the shielding plate 76. The lower piece 72 includes a pair of mounting posts 80 receiving in the corresponding through hole for mounting the housing 52 to the printed circuit board 100. The lower piece 72 further forms a pair of recessions 49 to receive the corresponding retention tangs 37 of the shield 56.

In this embodiment, the middle piece 74 forms a pair of recesses 82 to respectively receive the corresponding protrusions 84 of the upper piece 70 and the lower piece 72 for securing the upper piece 70, the lower piece 72 and the middle piece 74 therebetween in a stacked manner wherein the upper piece 70 further include a pair of downward assembling poles 84 received in the corresponding alignment holes 86 of the middle piece 74, and the lower piece 72 further includes an upward assembling pole 85 received in the corresponding alignment holes 86 of the middle piece 74, and the lower piece 72 further forms a pair of upward locating posts 87 received within the corresponding recesses 89 in the upper piece 70. In this embodiment, the lower piece 72 defines a plurality of through holes 91 and 93 to receive the tail sections of the lower row contacts 58 and the mounting legs 79 of the shielding plate 76 to extend therethough as an alignment spacer. Notably, the shielding plate 76 forms a front edge section 69 extending forwardly beyond a front edge of the mating tongue 54 for anti-mismating consideration, and a pair of lateral edge sections 67 extending either beyond or behind the side edge of the mating tongue 54 for locking with a latch 39 of the plug connector 10 (illustrated later). Understandably, the latch 39 may continuously contact the lateral edge sections 67 during the mating procedure from the initial mating position around the corner of the shielding plate 76 to the final locking position around a notch structure of the lateral edge section 67. In brief, the shielding plate 76 is essentially multifunctional to perform shielding, grounding, reinforcing, anti-mis-mating and locking. A metallic bracket 95 is soldered under the shield 56 and forms a pair of supporting legs 97 mounted into the through hole 103 of the printed circuit board 100 for supporting the receptacle connector 50 within the notch 102 of the printed circuit board 100. The shield 56 further includes an upside-down U-shaped structure (not labeled) on a rear portion covering the rear portion of the housing 52 with a pair of mounting legs 55 received in the through holes 104 for mounting to the printed circuit board 100 and a pair of locking tabs 59 received in the recesses 99 of the upper piece 70 after the shield 56 is rearwardly assembled to the housing 52 in a front-to-back direction. Notably, the mounting leg 79 of the shielding plate 76 share the same through hole with the neighboring grounding contact tail for enhancing grounding effect.

Figure 14:
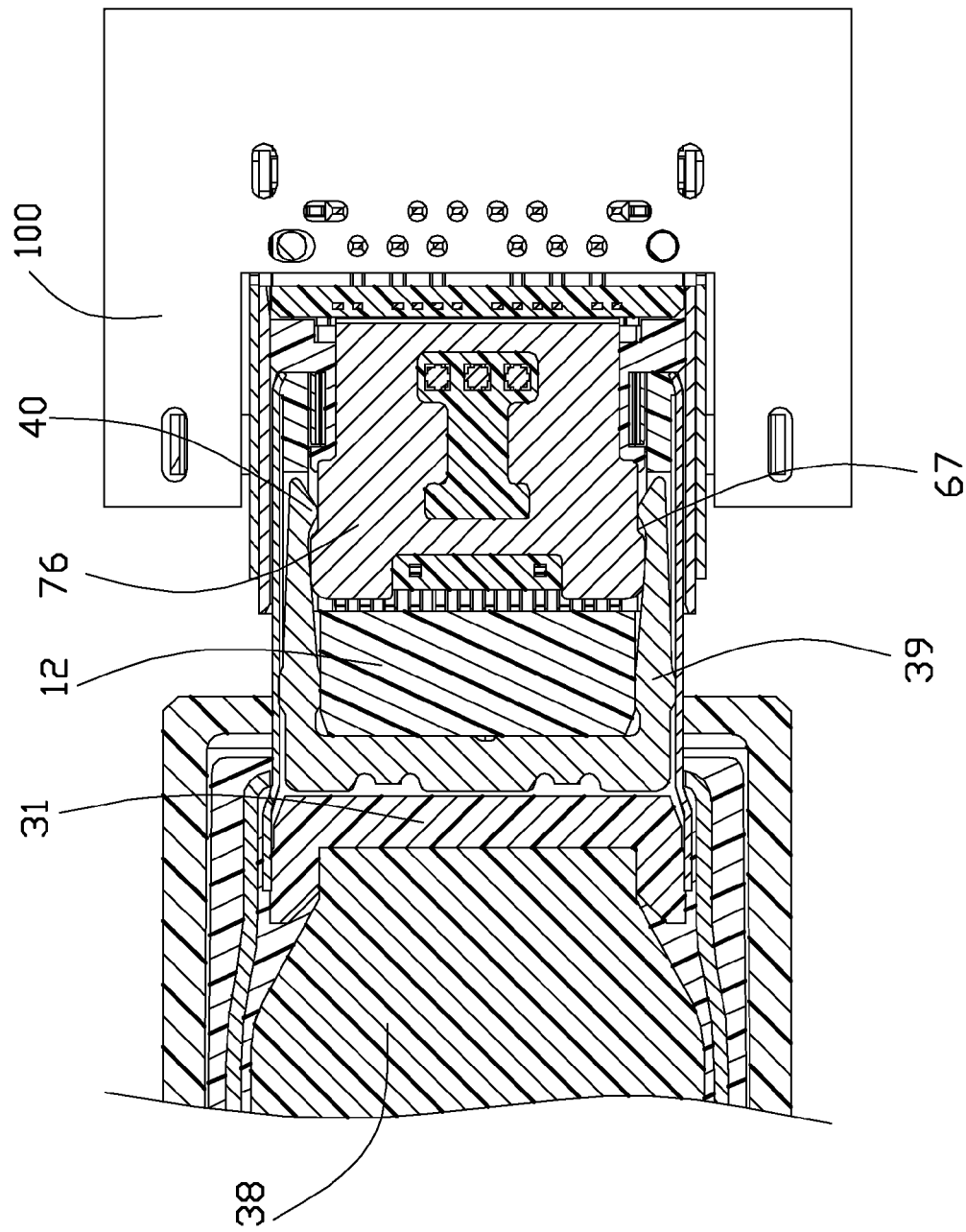
FIG. 14 is a cross-sectional view of the mated plug connector and receptacle connector of FIG. 1 to show how the latch of the plug connector is lockable engaged with the shielding plate of the receptacle connector.
Figure 15:
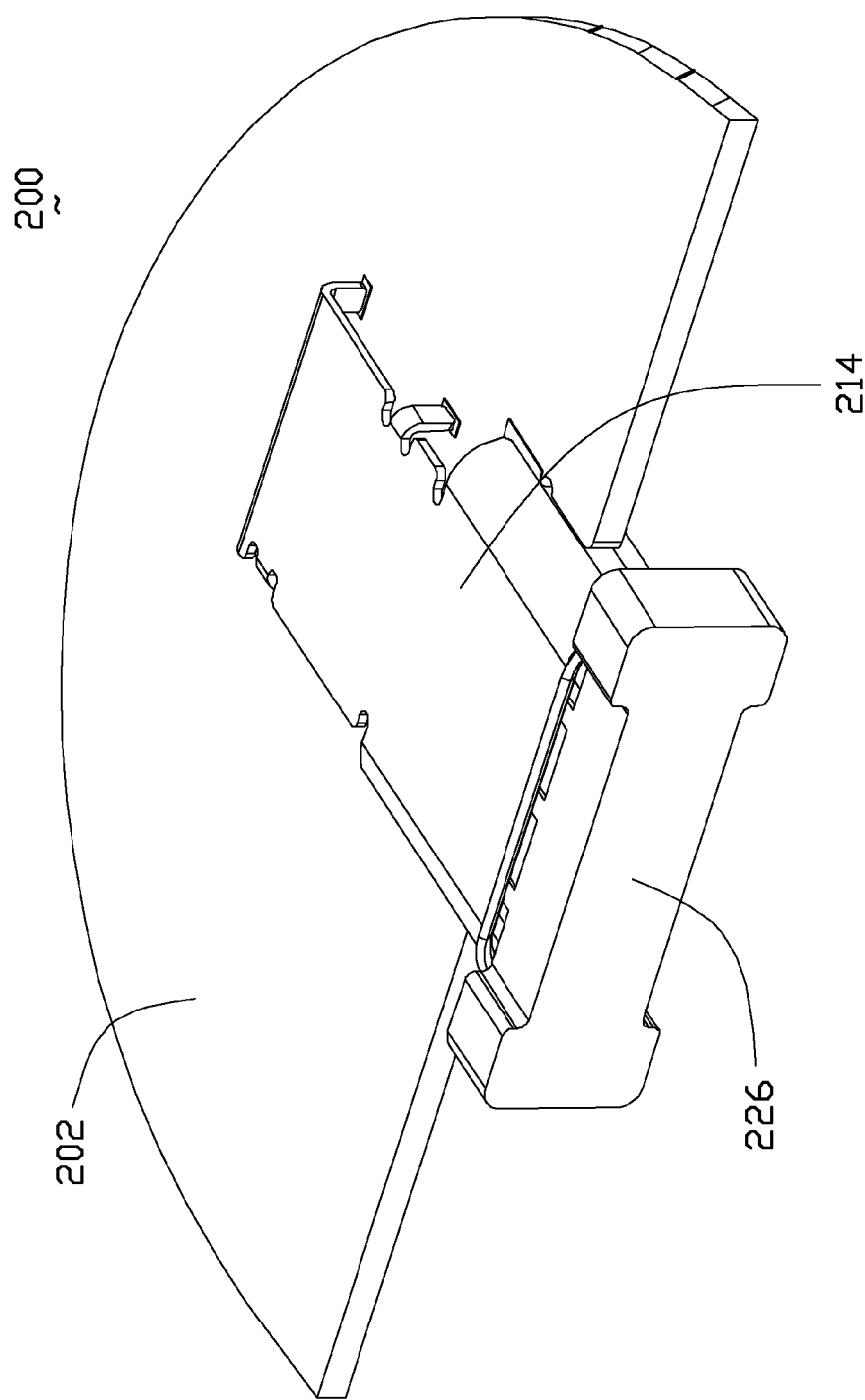
FIG. 15 is a perspective view of a test printed circuit board (PCB) assembly of a second embodiment according to the invention.
Figure 16:
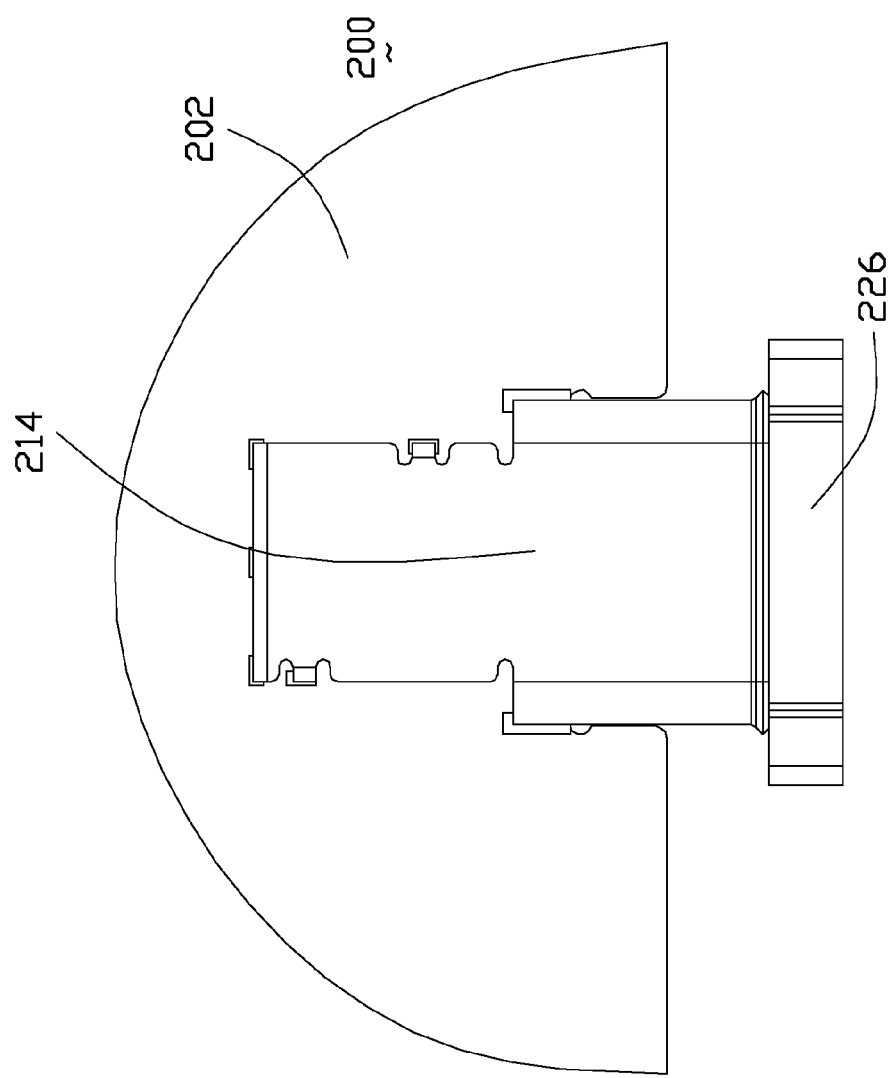
FIG. 16 is a top view of the test PCB assembly of FIG. 18.
Figure 17:
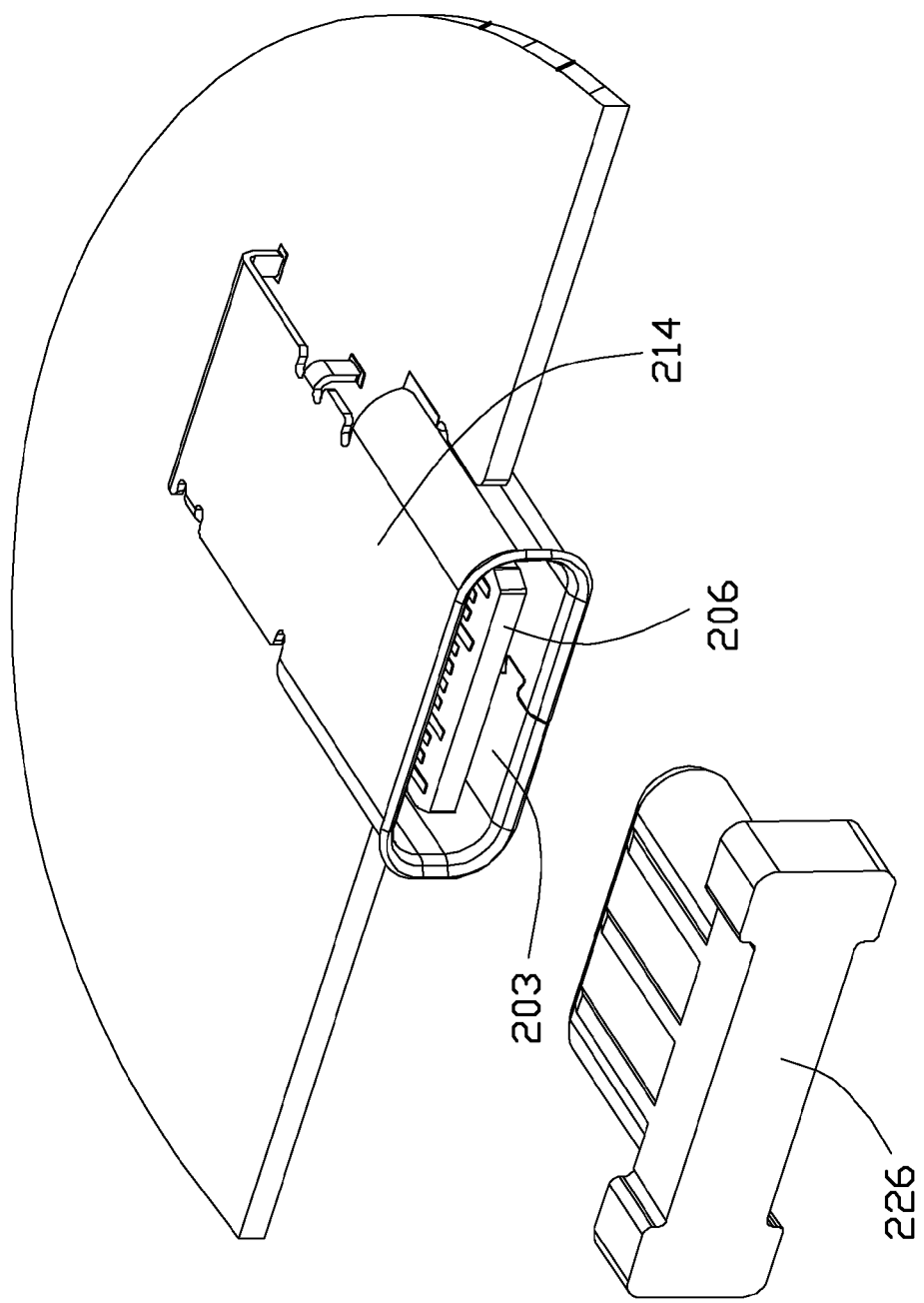
FIG. 17 is an exploded perspective view of the test PCB assembly of FIG. 18 wherein the dummy plug is detached from the receptacle connector.
Figure 18A:
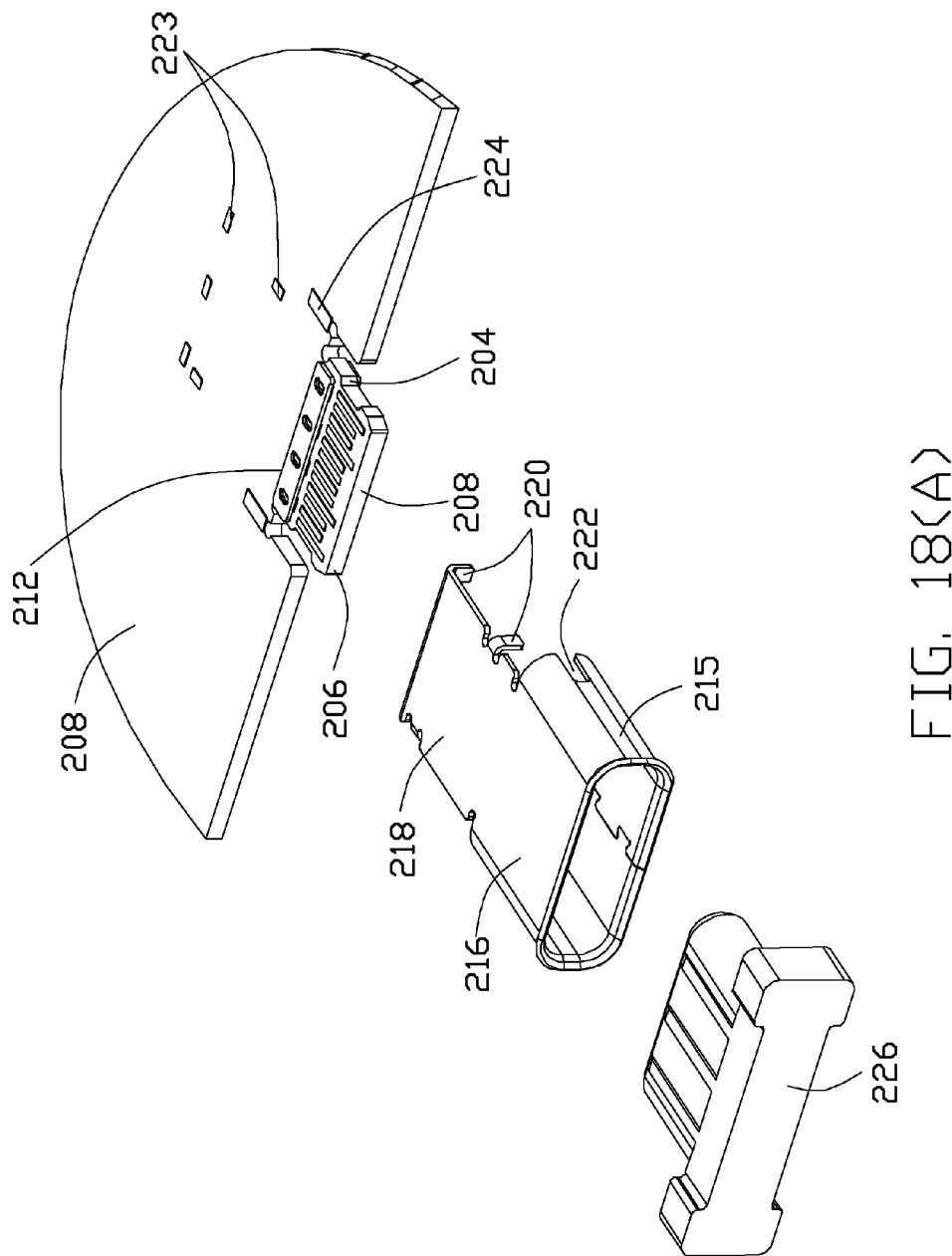
FIG. 18(A) is a further exploded perspective view of the test PCB assembly of FIG. 15 wherein the metallic shell is further disassembled from the PCB.
Figure 18B:
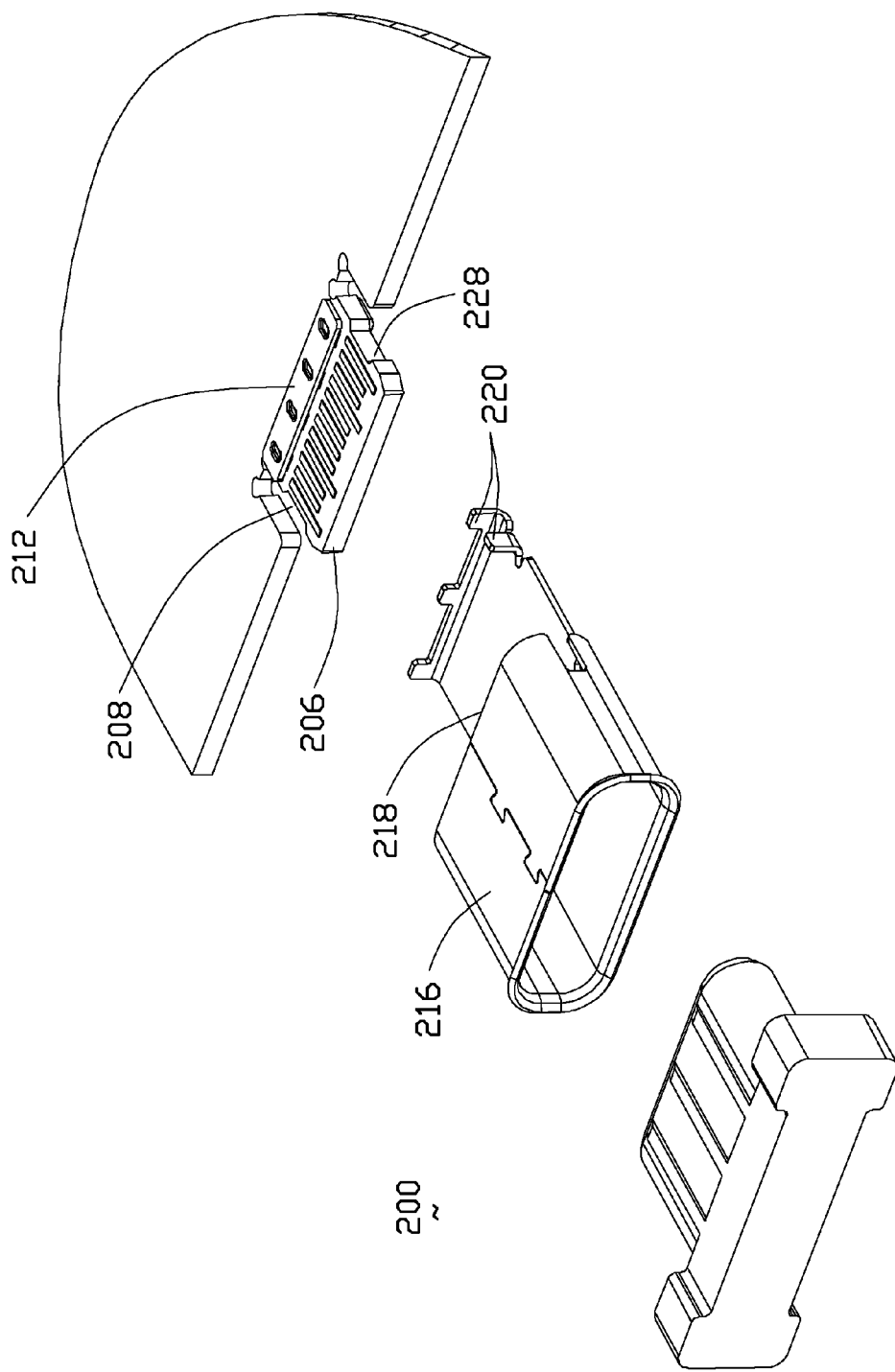
FIG. 18(B) is another exploded perspective view of the test PCB assembly of FIG. 18(A).
Figure 19:
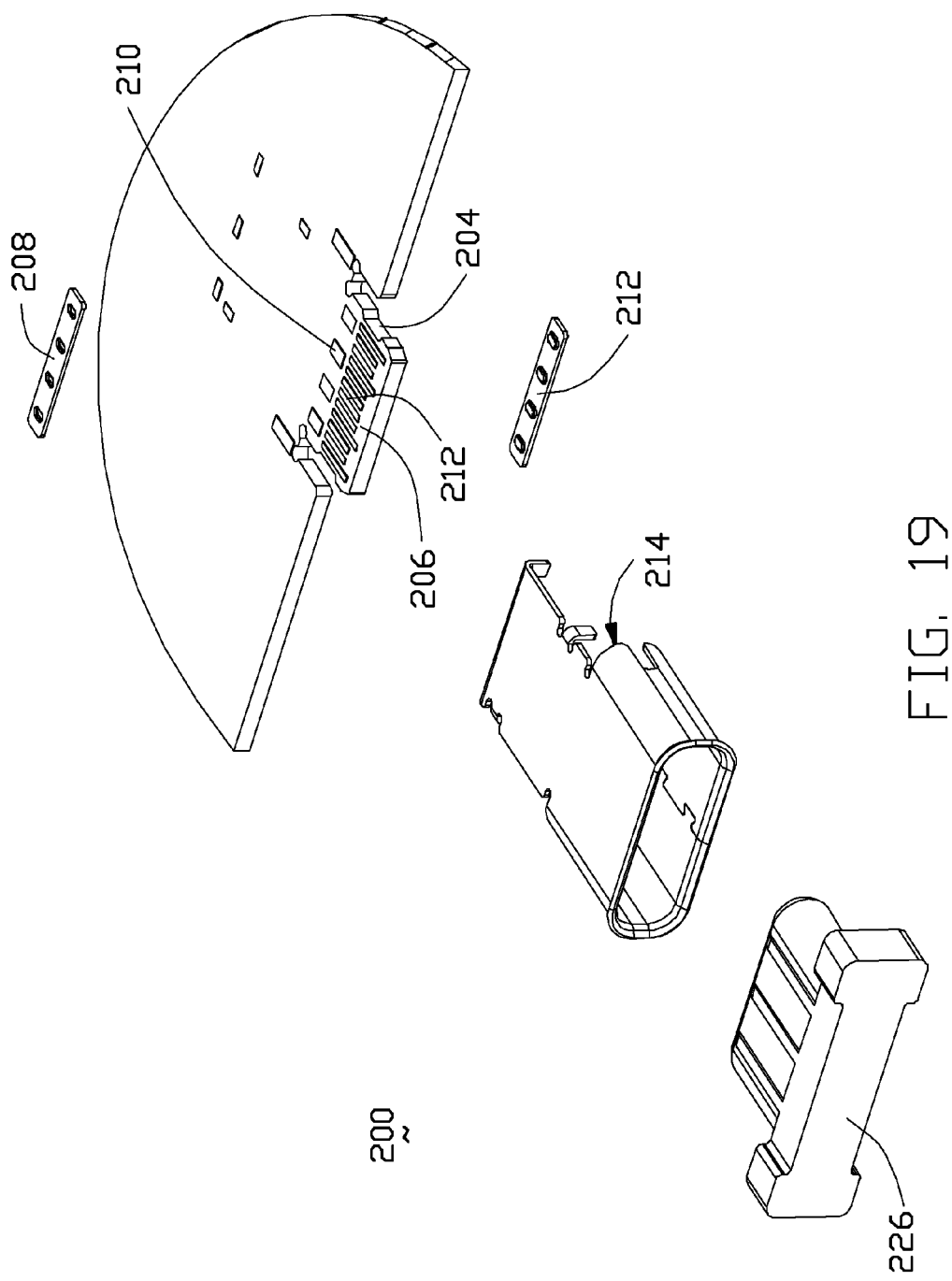
FIG. 19 is a further exploded perspective view of the test PCB assembly wherein the spring finger contact bars are removed from the PCB.
Figure 20A:
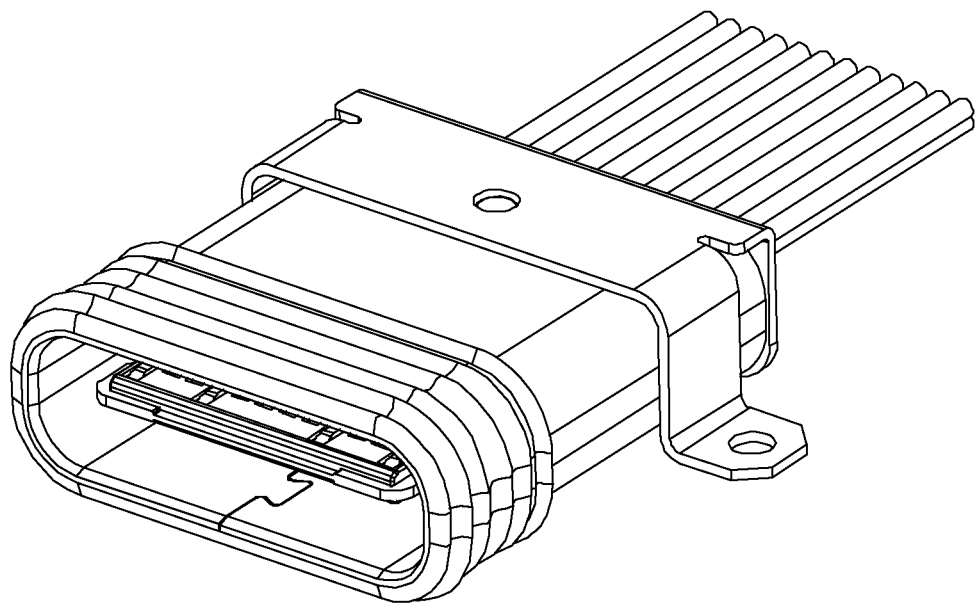
FIG. 20(A) is a front assembled perspective view of a third embodiment of the waterproof receptacle connector which is mechanically and electrically connected to the wires instead of mounting on the printed circuit board.
Figure 20B:
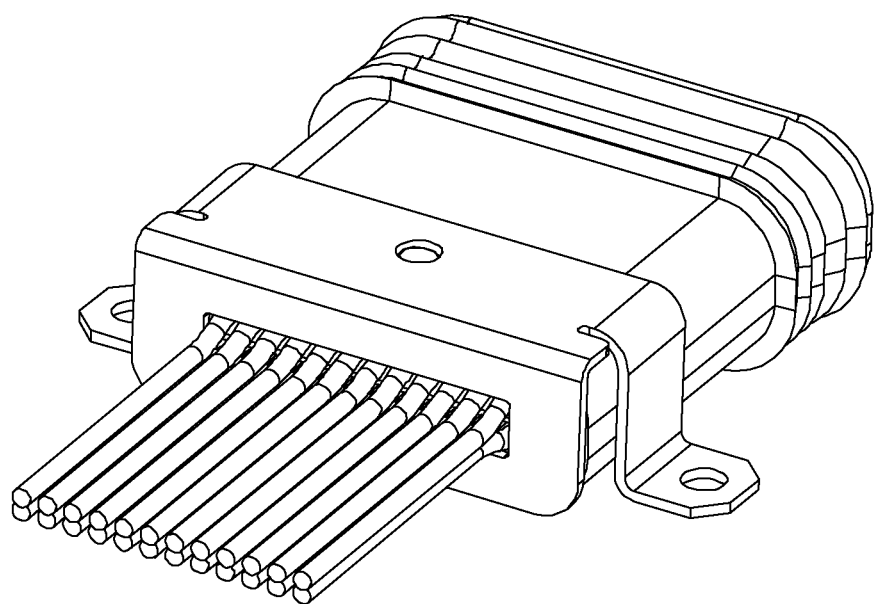
FIG. 20(B) is a rear assembled perspective view of the receptacle connector of FIG. 30(A).
Figure 21A:
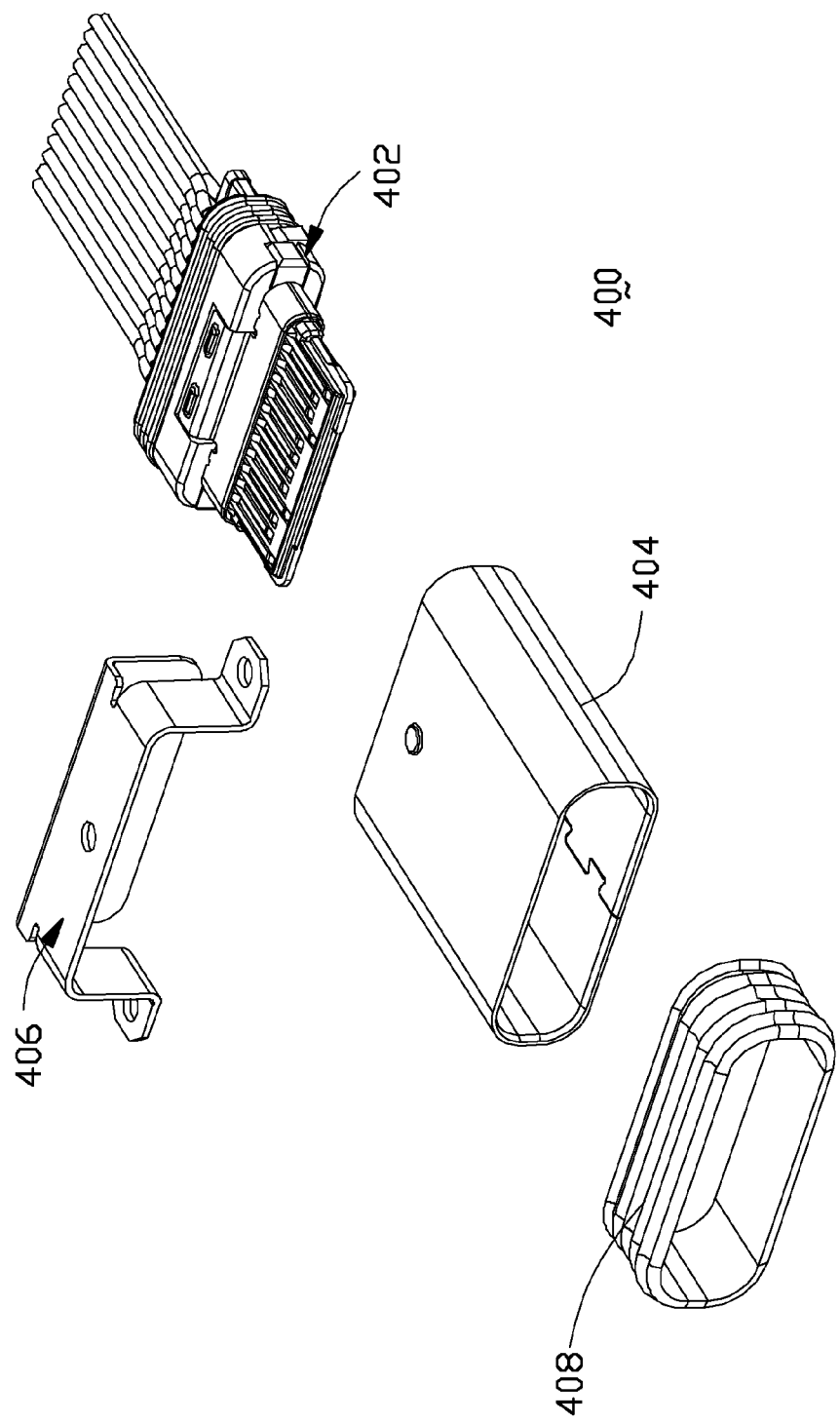
FIG. 21(A) is a front exploded perspective view of the receptacle connector of FIG. 20(A).
Figure 21B:
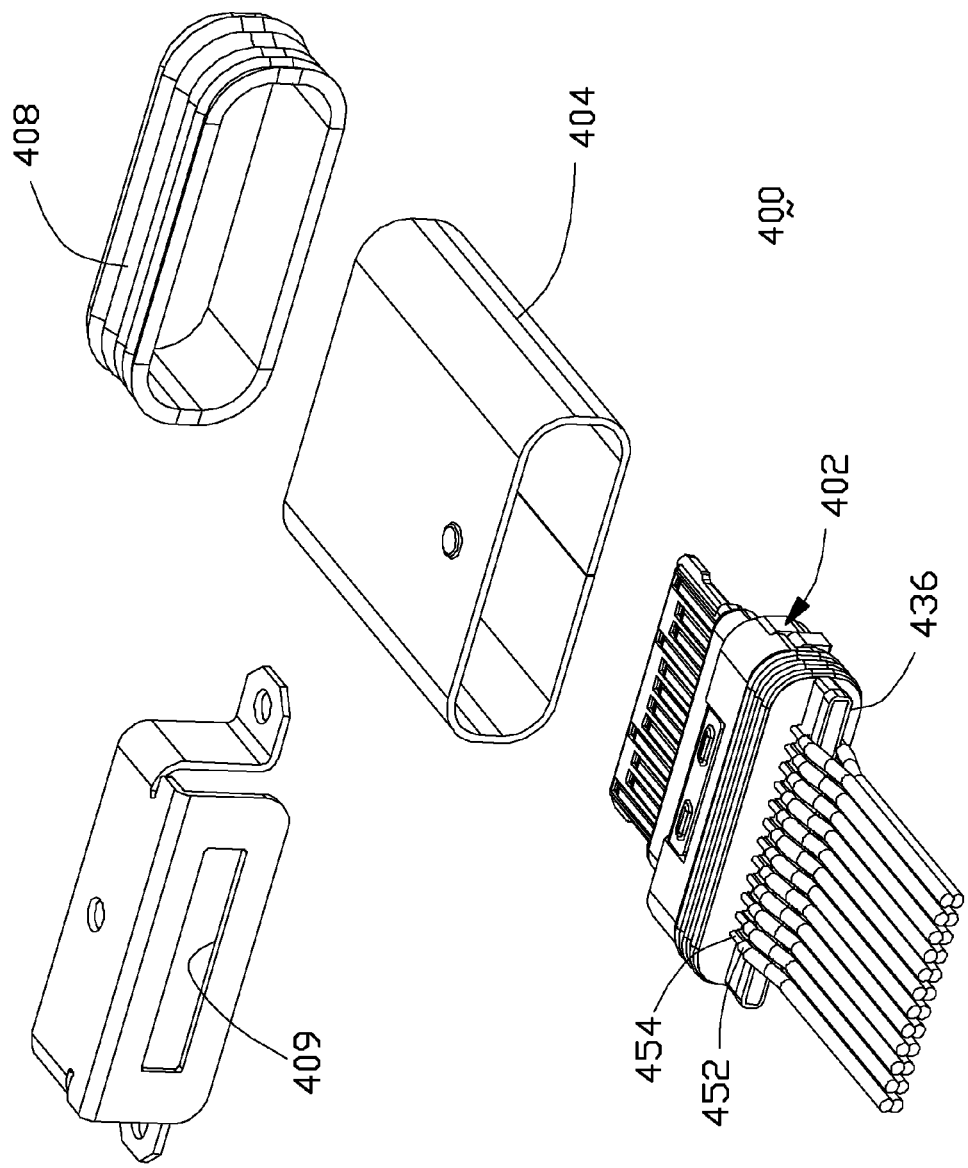
FIG. 21(B) is a rear exploded perspective view of the receptacle connector of FIG. 20(B).
Figure 22A:
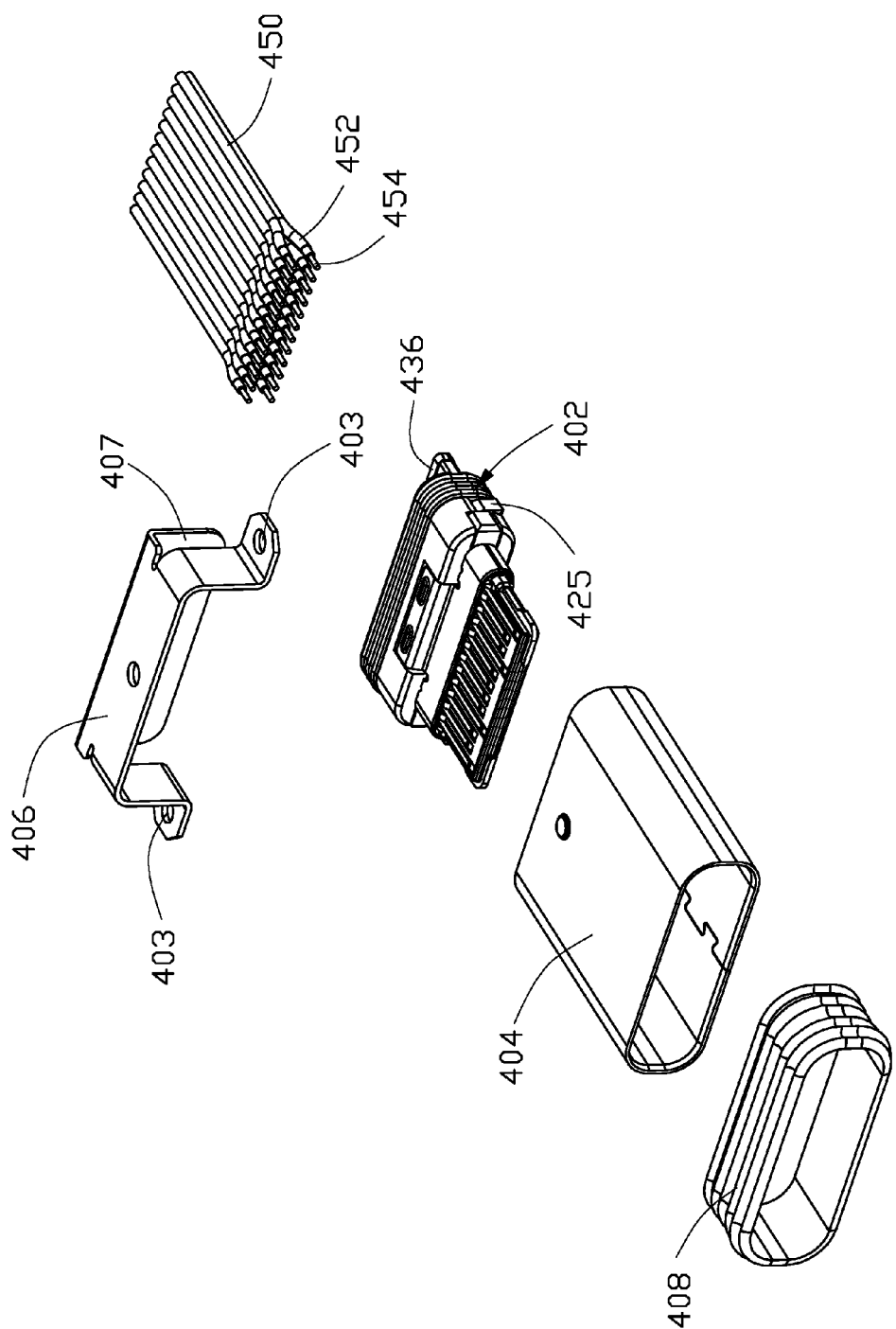
FIG. 22(A) is a further front exploded perspective view of the receptacle connector of FIG. 21(A) without the bracket thereof.
Figure 22B:
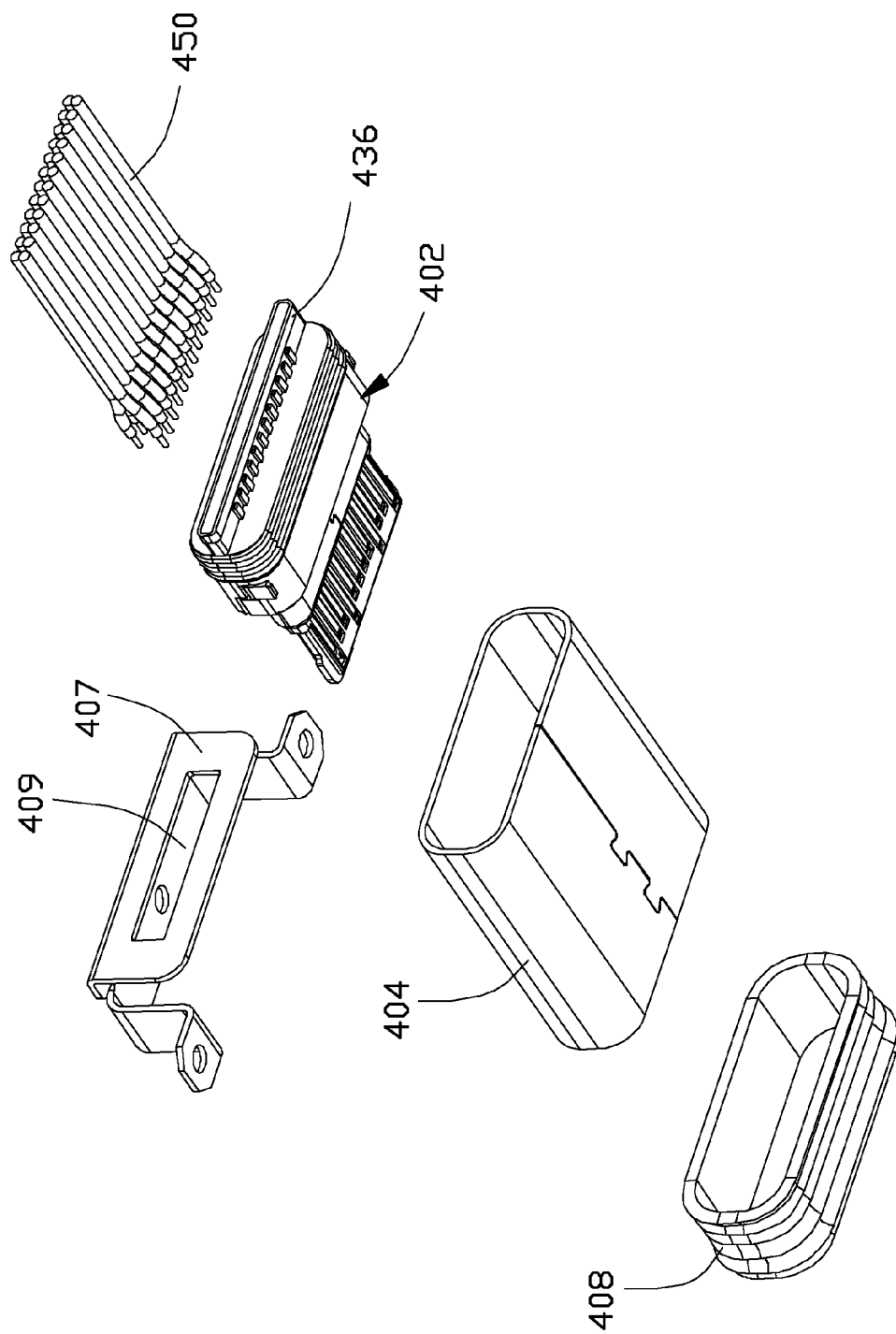
FIG. 22(B) is a further rear exploded perspective view of the receptacle connector of FIG. 21(B) without the bracket thereof.
Figure 23A:
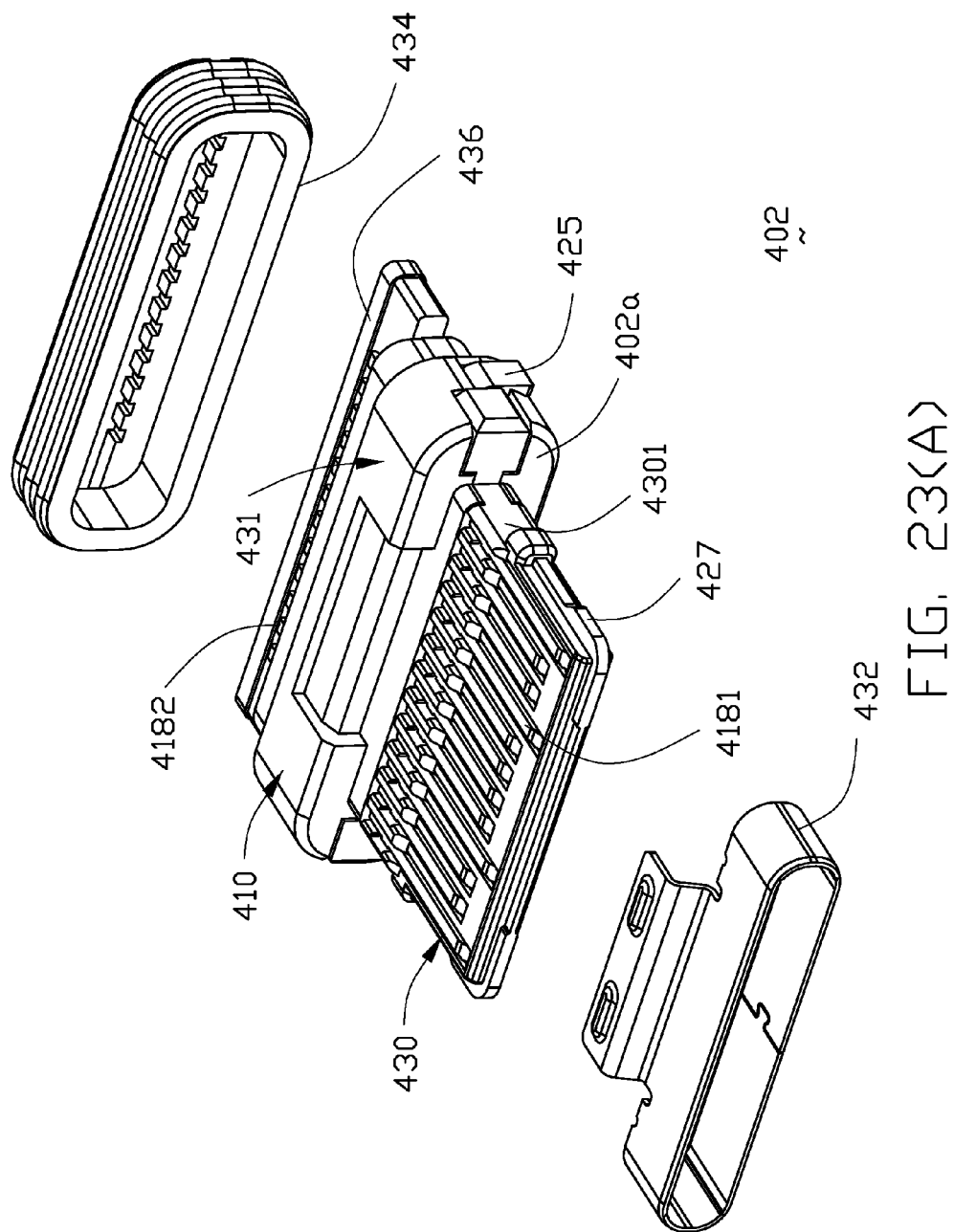
FIG. 23(A) is a front exploded perspective view of the terminal module assembly of the receptacle connector of FIG. 22(A).
Figure 23B:
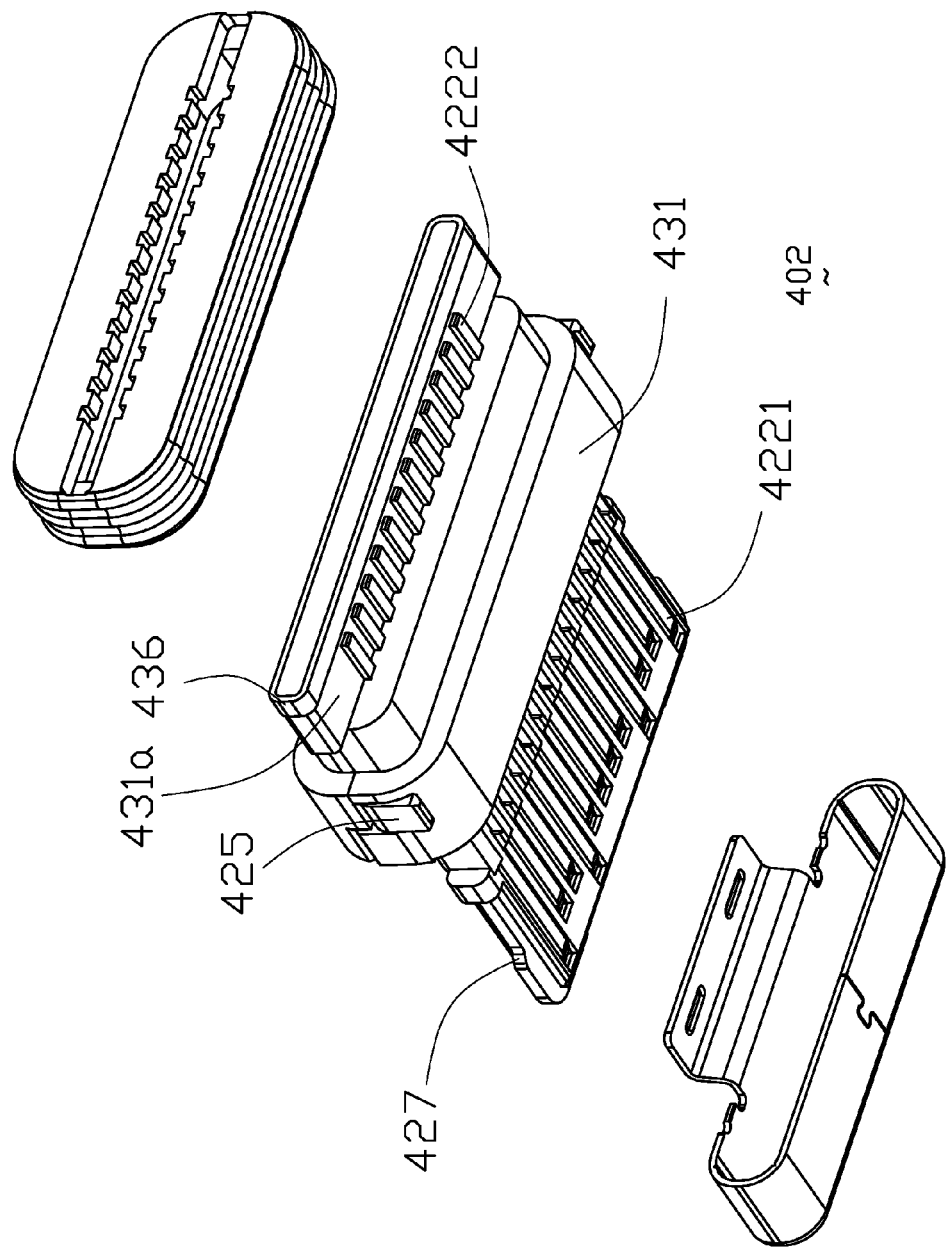
FIG. 23(B) is a rear exploded perspective view of the terminal module assembly of the receptacle connector of FIG. 22(B).
Figure 24A:
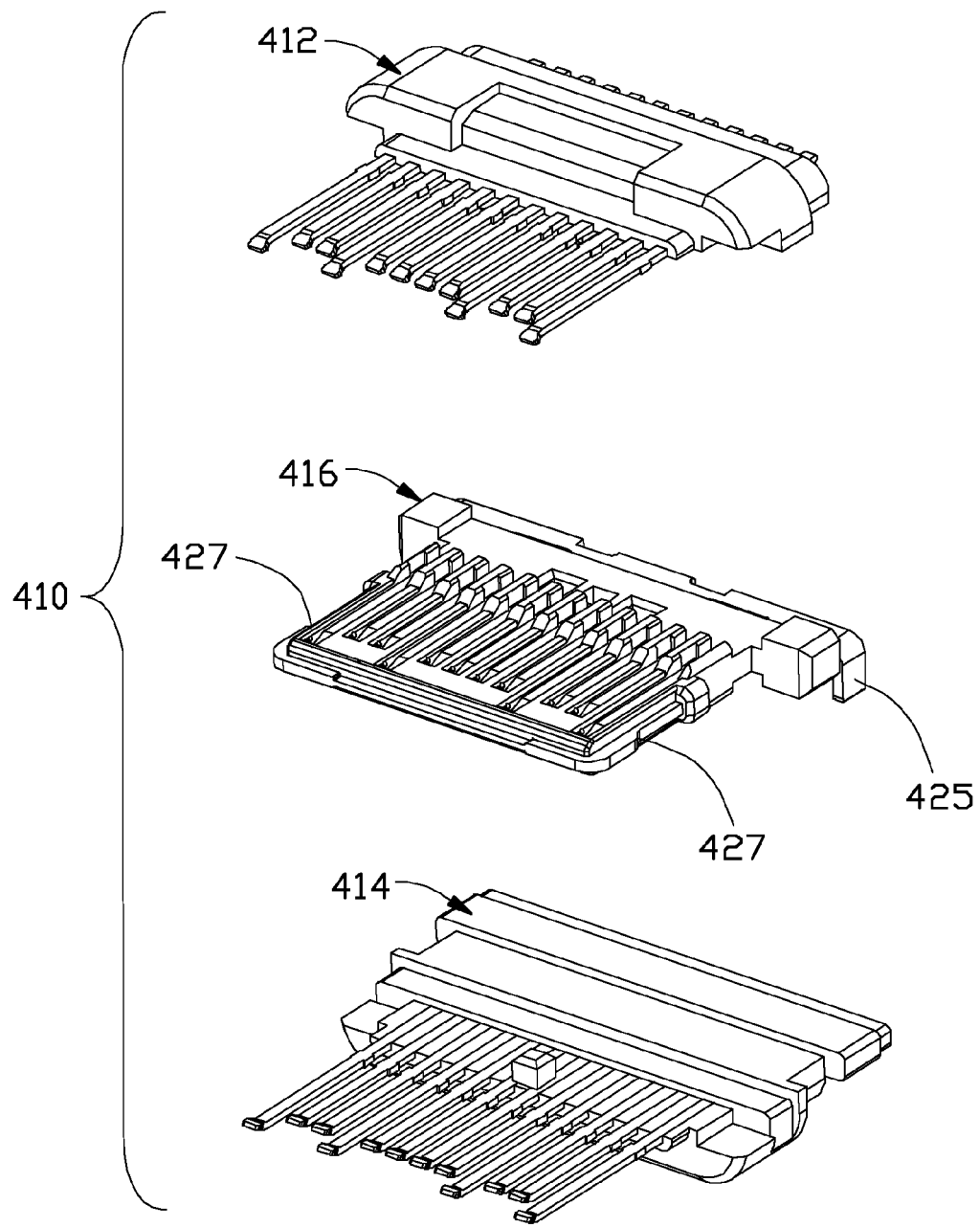
FIG. 24(A) is a front exploded perspective view of the terminal module of the receptacle connector of FIG. 23(A).
Figure 24B:
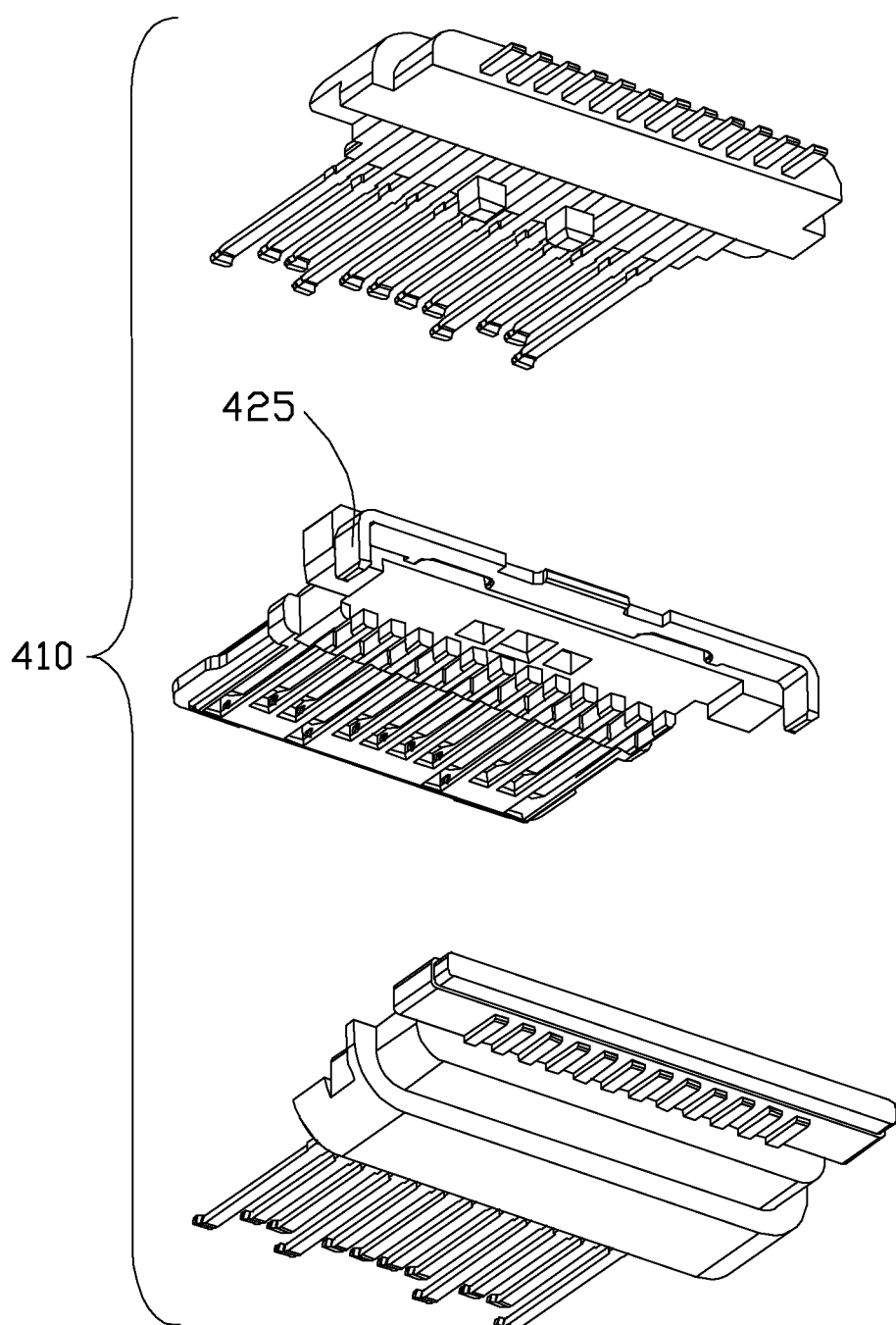
FIG. 24(B) is a rear exploded perspective view of the terminal module of the receptacle connector of FIG. 23(B).
Figure 25A:
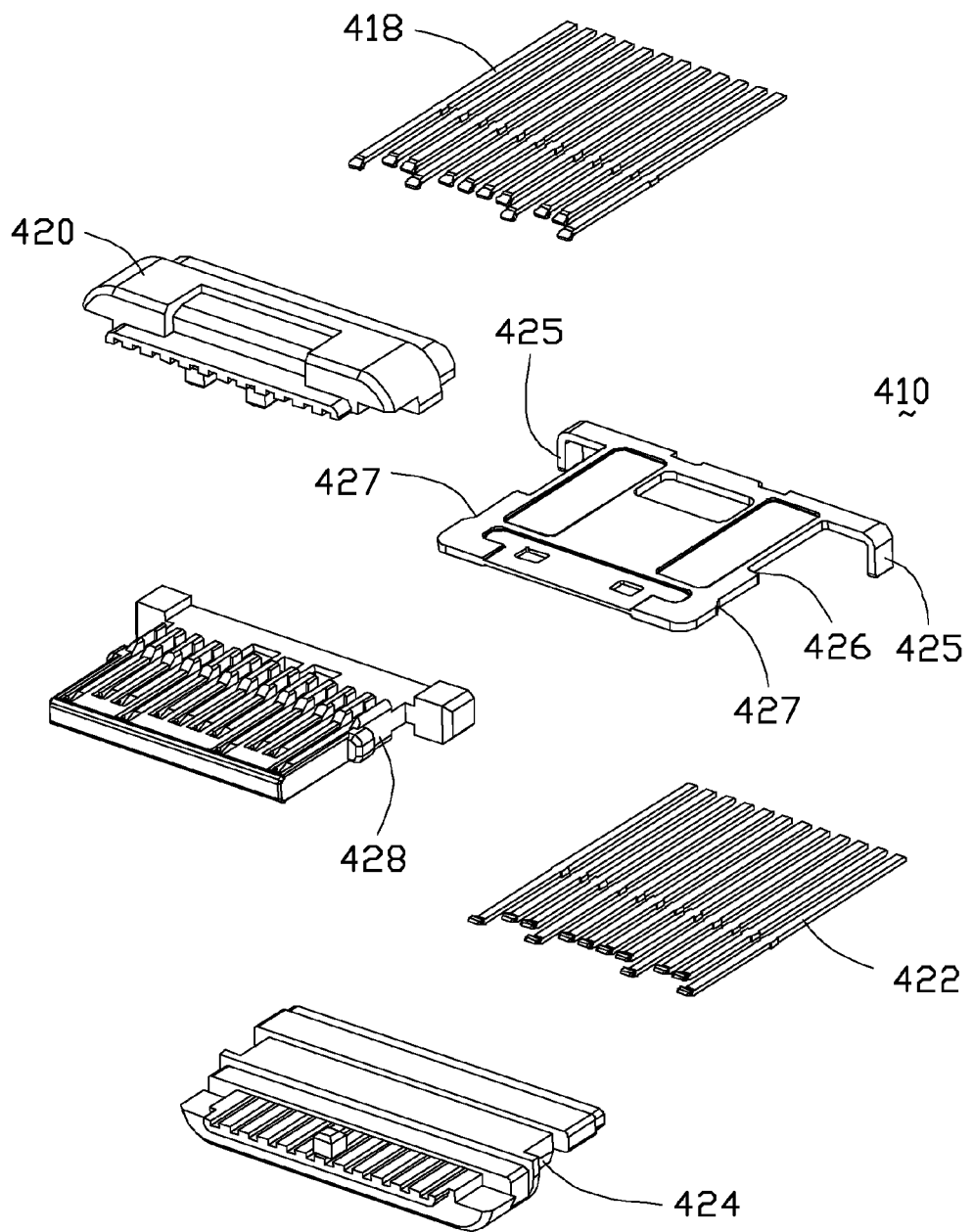
FIG. 25(A) is a further front exploded perspective view of the terminal module of the receptacle connector of FIG. 24(A).
Figure 25B:
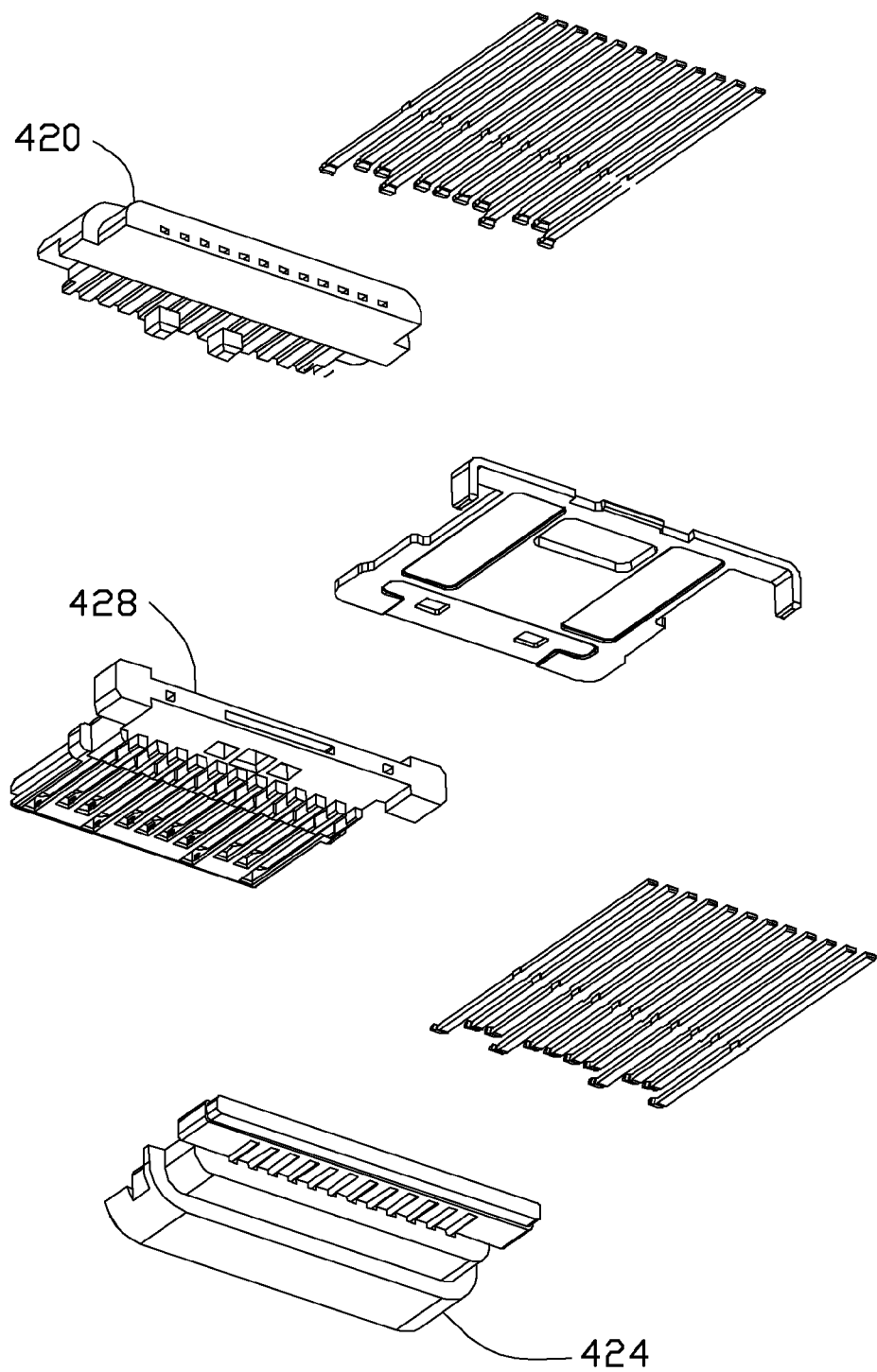
FIG. 25(B) is a further rear exploded perspective view of the terminal module of the receptacle connector of FIG. 24(B).

Referring to FIGS. 10-13(B) and further FIG. 14, the plug connector 10 includes an insulative housing 12 having a capsular front contour with a rectangular receiving cavity 14 therein and enclosed in a metallic shell 16. Opposite upper and lower rows of contacts 18 are disposed in the corresponding passageways 32 of the housing with corresponding contacting sections 20 extending into the receiving cavity 14 wherein the upper and lower rows of contacts 18 are diagonally symmetrically arranged with each other in both electrical and mechanical arrangement so as to meet the so-called flappable mating, i.e., the dual opposite orientations. A pair of metallic upper and lower EMI (Electro-Magnetic Interference) spring plates 22 are enclosed in the shell 16, and each of the EMI spring plates 22 is sandwiched between the shell 16 and the housing 12 and includes a front resilient region 24 extending inwardly toward and into the receiving cavity 14 and in front of the contacting sections 20, a rear abutting region 26 to abut against the shell 16, and a pair of side retention regions 28 retainably engaged within corresponding side portions of the housing 12. A pair of tapes 30 are disposed upon two opposite sides of the housing 12 so as to isolate the contacting section 20 from the shell 16. A spacer 34 is located behind the housing and defines a plurality of passages 35 through which the tail sections 21 of the contacts 18 rearwardly extend. A recessed region 36 is formed in a rear face of the spacer 34 to receive a front edge region of a paddle card 38 wherein the tail sections 21 of the contacts 18 extending through the corresponding passages 35, are soldered upon the corresponding pads 37. The spacer 34 forms a forward extending blade 31 with a pair of forward protrusions 33 on two sides to be commonly inserted into a back side of the housing 12 wherein the protrusions 33 of the blade 31 are essentially received in the side slots 13 of the housing 12. A U-shaped metallic latch 39 of a blanking type received in the side slots 13 of the housing 12 with a pair of locking heads 40 extending into the two opposite lateral sides of the receiving cavity 14 to lock with the lateral edge sections 67 of the shielding plate 76 of the receptacle connector 50 during mating Understandably, the latch 39 is restrained by the blade 31, the comb structures on the blade 31, the protrusions 33 of the blade 31, the slots 13 and an interior rear face of the housing 12.

A cable 41 behind the paddle card 38, encloses a plurality of wires 42 regulated by a pair of organizer 43 to be soldered upon a rear region of the paddle card 38. Via the protrusions and openings (not labeled), an auxiliary rear shell 17 grasps the shell 16 to shield the paddle card 38, and a clipper 44 grasps the rear shell 17 and further the cable 41 behind the paddle card 38. Opposite front overcoat 45 and rear overcoat or strain relief 46 are overmolded upon the rear shell 17 and the clipper 44, respectively. Finally, a cover 47 essentially fully covers the clipper 44, the front overcoat 45 and the rear overcoat 46. During mating, the mating tongue 54 is received in the receiving cavity 14 with the corresponding contacting sections 60 of the contacts 58 of the receptacle connector 50 connected to the contacting sections 20 of the contacts 18 of the plug connector 10 wherein the latch 39 is locked with the shielding plate 76, and the front resilient region 24 of the spring plate 22 contacts the collar 64.

Referring to FIGS. 15-19, the test printed circuit board (PCB) assembly 200 includes a test PCB 202 with a pair of slots 204 in a front edge portion to form a mating tongue 206 therebewteen. A plurality of pads 208 and a plurality of grounding pads 210 are formed on opposite surfaces of the mating tongue 206. The pads 208 are arranged with the diagonally symmetrical manner for flippable use. A pair of spring contact bars 212 are soldered upon the corresponding grounding pads 210. A metallic shield 214 is attached to the PCB 202 with two lateral sides 215 received in the corresponding slots 204, respectively, and includes a front tubular capsular portion 216 to enclose the mating tongue 206 to define a mating cavity 213 and a rear planar portion 218 to cover the PCB 202 with the corresponding soldering tabs 220 soldered upon the corresponding pads 223 on the PCB 202. The shield 214 further forms a pair of grooves 222 in two lateral sides 215 to mechanically sandwich portions of the PCB 202 behind the corresponding slots 204 in a soldered manner with the corresponding pads 224 electrically. A dummy plug 226 is detachably inserted into the tubular capsular portion 216 for anti-dust in a flippable manner. Notably, in a real practice for testing, the dummy plug 226 will be replace with the real plug connector instead wherein the deflectable contacts the plug connector contact the pads 208 and the EMI spring plates contact the spring contact bars 212. It is noted that the mating tongue 206 forms a pair of notches 228 in two opposite lateral sides with corresponding latching structures thereof for locking to the latches of the plug connector during testing.

Figure 26:
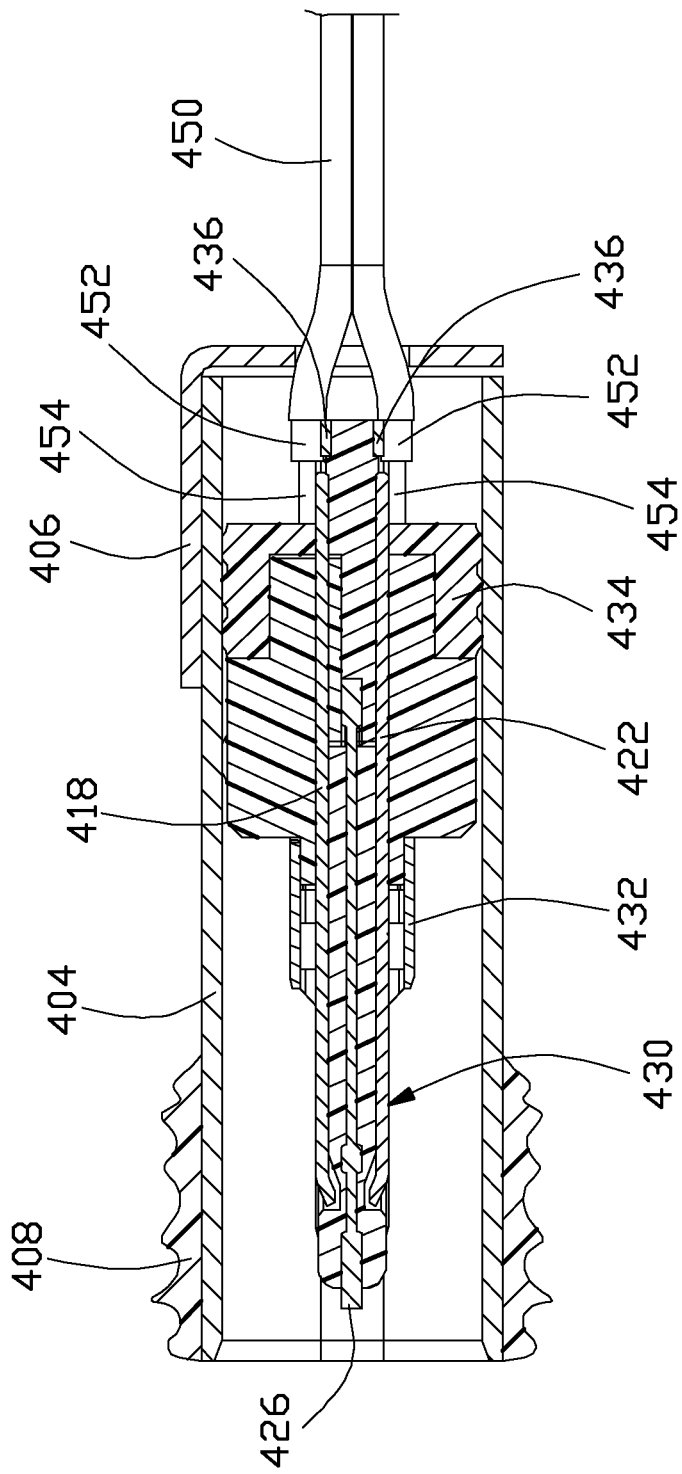
FIG. 26 is a cross-section view of the receptacle connector of FIG. 20(A).

Referring to FIGS. 20-26, a water proof receptacle connector 400 of a third embodiment of this present invention, includes a terminal module assembly 402 enclosed within a capsular metallic shield 404 which is further secured with a metallic bracket 406. A rubber/silicon outer seal 408 is located upon a circumferential exterior surface of the shield 404 around the front edge region. The terminal module assembly 402 includes a terminal module 410 essentially composed of an upper part 412 and a lower part 414 commonly sandwiching a middle part 416 therebetween. The upper part 412 includes a plurality of upper contacts 418 integrally formed with an upper insulator 420 via an insert molding process, the lower part 414 includes a plurality of lower contacts 422 integrally formed with a lower insulator 424 via another insert molding process, and the middle part 416 includes a metallic shielding plate 426 embedded within a middle insulator 428 via another insert molding process. The shielding plate 426 defines a pair of side locking sections 427 at opposite sides thereof and includes a pair of connecting legs 425 laterally extending and exposed outside of the lower insulator 424 to mechanically and electrically connect to the shield 404. Notably, the upper part 412 is downwardly assembled to an upper side of the middle part 416 while the lower part 414 is upwardly assembled to a lower side of the middle part 416. The assembled terminal module 410 forms a mating tongue 430 extending from a rear base 431 and the locking sections 427 extending out of the side edge of the mating tongue 430 for engagement with the corresponding latches on the complementary plug connector. A metallic collar 432 is assembled to a root region 4301 or thicken step of the mating tongue 430 for mating with the EMI spring plate of the complementary plug connector. That is, as best shown in FIGS. 26 (A) and 26(B), the terminal module 402 includes an insulative housing 402a that consists of the upper insulator 414 and lower insulator 424, the contacts 418, 422, the shielding plate 426 and the metallic collar 432. The insulative housing 4021 forms the rear base 431, the mating tongue 430 and a cable supporting portion 431a extending rearwards from the rear base 431. Each of the upper contacts and lower contacts (or terminals) comprises a front contacting section 4181/4221 located upon opposite surfaces of the mating tongue 430 and rear tail section 4181/4222 located upon the cable supporting portion 431a.

Figure 27:
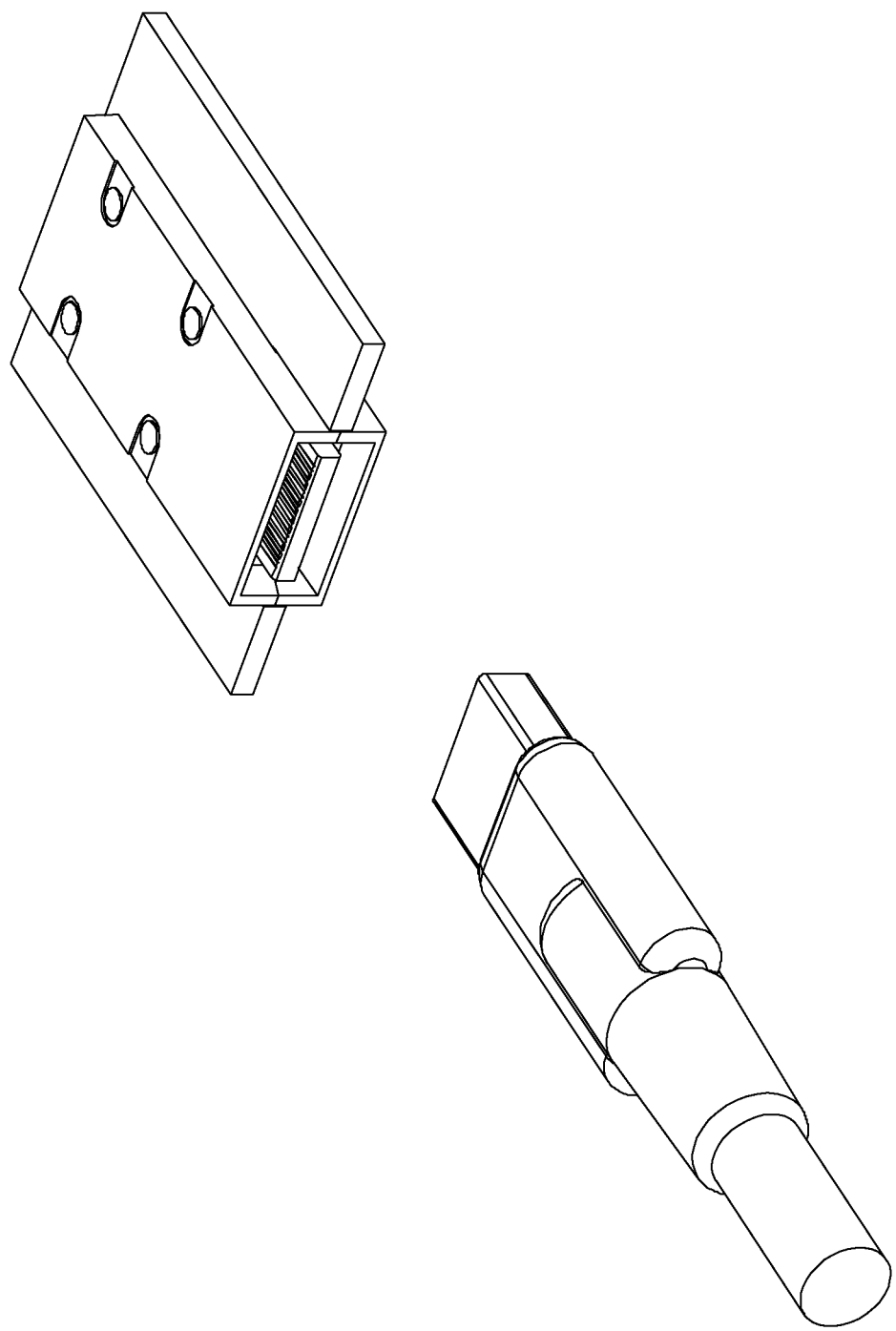
FIG. 27 is perspective view of the plug connector and the receptacle connector according to another embodiment of the instant invention.
Figure 28:
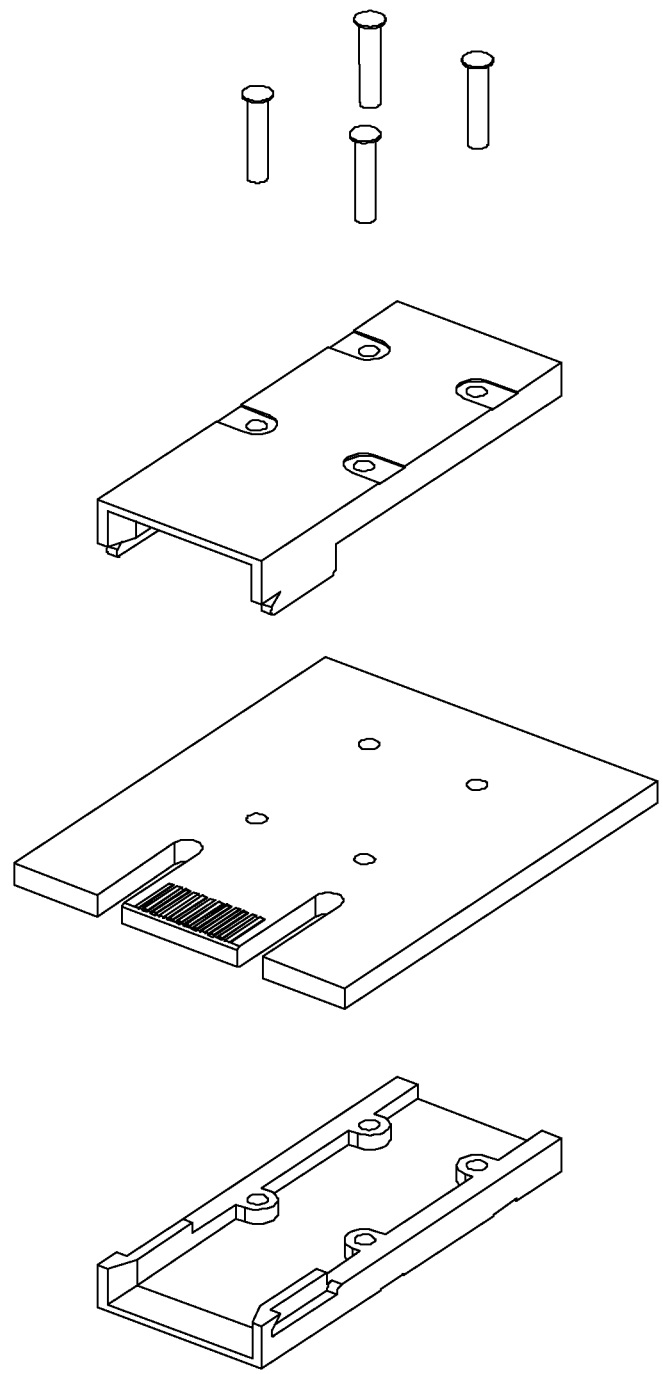
FIG. 28 is an exploded perspective view of the receptacle connector of FIG. 27 and the according plug connector.
Figure 29:
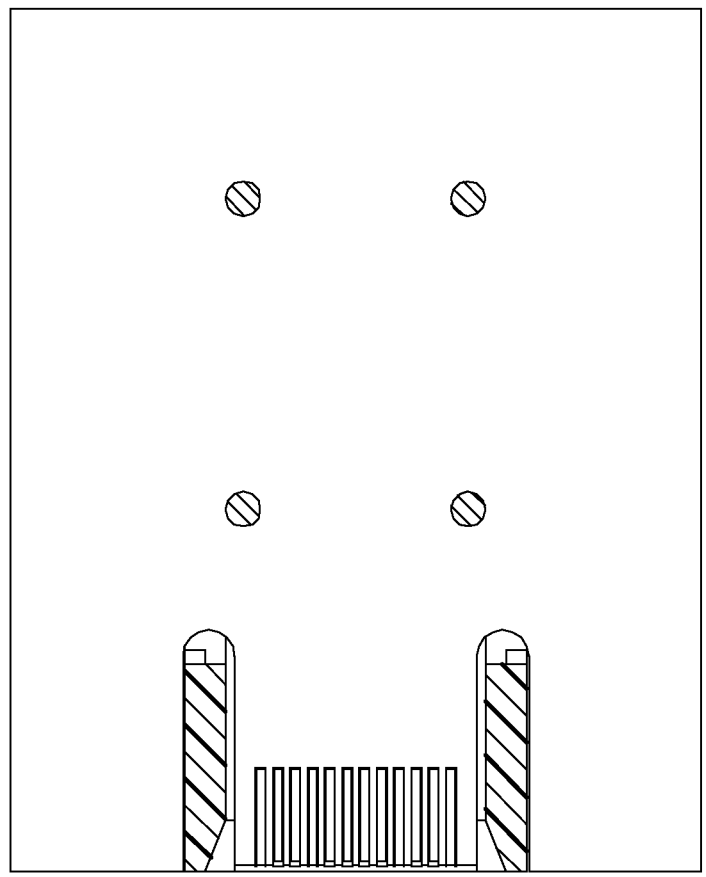
FIG. 29 is an illustration cross-sectional view of the plug connector and the receptacle connector of FIG. 27 in a ready-to-mate condition.
Figure 29:
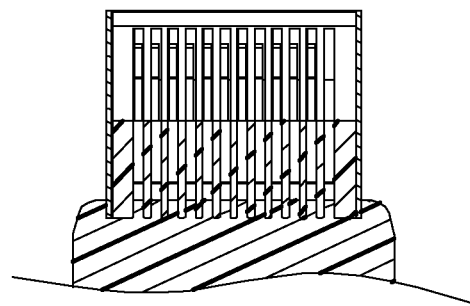

A silicon inner seal 434 covers the rear base 431 of the terminal module 410 to not only seal the tail 4182, 4222 of the contacts 418, 422 except the soldering ends thereof but also cover the gap between the shield 404 and the terminal module 410. A grounding bar 436 is located at a rear edge region, i.e, the cable supporting portion 431a of rear base of the terminal module 410 for soldering to the braiding layers 452 of the corresponding micro-coaxial cables 450 illustrated later. The metallic shell 404 is retained on the rear base 431 of the terminal module 410 and surrounding the mating tongue 430 to forming the mating cavity. The pair of connecting legs 425 of the shielding plate 426 exposed outside of the lower insulator 424 to mechanically and electrically connect to the shield 404. The bracket 406 forms a rear wall 407 with therein a window 409 or opening through which the micro-coaxial cables 450 extend, wherein in each micro-coaxial cables 450 the inner conductor 454 is soldered to the soldering end of the corresponding contact 418, 422 while the braiding layer 452 is soldered upon the grounding bar 436. The bracket 406 includes a pair of mounting portions 403 for mounting to an external part. In this embodiment, the seam of the shield 404 is welded for assuring waterproof. FIGS. 27-29 are essentially FIGS. 41-43 of the parent application Ser. No. 14/558,732 which reflects the similar concept of the embodiment shown in FIGS. 15-19 of the instant invention.

However, the disclosure is illustrative only, changes may be made in detail, especially in matter of shape, size, and arrangement of parts within the principles of the invention.

What is claimed is:

1. A receptacle connector comprising:
a terminal module defining a rear base and a mating tongue extending forwards from the rear base and two rows of contacts;
a metallic shielding plate embedded within the mating tongue with two opposite side locking notches exposed to the mating tongue;
the contacts comprising plate contacting sections located upon opposite surface of the mating tongue and tails located upon a rear edge region of the rear base;
a capsular metallic shield surrounding the terminal module and the mating tongue extending into metallic shield;
a plurality of micro-coaxial cables located behind the terminal module and comprising inner conductors soldered with the tails of the contacts.

2. The receptacle connector as claimed in claim 1, further comprising a grounding bar located at the rear edge region of rear base of the terminal module and soldered to braiding layers of the corresponding micro-coaxial cables.

3. The receptacle connector as claimed in claim 2, wherein said grounding bar is essentially exposed upon two opposite surfaces of the rear edge region.

4. The receptacle connector as claimed in claim 1, further comprising a metallic bracket secured with the metallic shield and defining a rear wall with a window through which the micro-coaxial cables extend.

5. The receptacle connector as claimed in claim 4, wherein said bracket has a pair of mounting portions for mounting to an external part.

6. The receptacle connector as claimed in claim 1, comprising a rubber or silicon outer seal which is located upon a circumferential exterior surface of the shield around a front edge region thereof.

7. The receptacle connector as claimed in claim 1, comprising a silicon inner seal covers the rear base of the terminal module to not only seal the tails of the contacts but also cover a gap between the metallic shield and the terminal module.

8. A receptacle connector comprising:
a terminal module essentially of an insulative housing with two rows of contacts therein, said housing forming a rear base and a mating tongue, each of said contacts including a front contacting section exposed upon a corresponding surface of the mating tongue, a rear tail section;
the mating tongue defining a root portion near to the rear base and the root portion being thicker than a front portion of the mating tongue;
a metallic shield enclosing said terminal module;
a silicon inner seal, wherein the inner seal covers the rear base of the terminal module to seal a gap between the metallic shield and the terminal module; and a rubber or silicon outer seal, wherein the outer seal is located upon a circumferential exterior surface of the metallic shield around a front edge region thereof.

9. The receptacle connector as claimed in claim 8, wherein a plurality of cables are electrically and mechanically directly connected the rear tail sections, a grounding bar is located around the rear tail sections of said terminals to be electrically and mechanically directly connected to braiding layers of the corresponding wire, respectively.

10. The receptacle connector as claimed in claim 8, further including a metallic bracket mounted upon the shield and having mounting portions for mounting to an external part.

11. The receptacle connector as claimed in claim 10, wherein said bracket further forms a window through which said wires extend rearwardly.

12. The receptacle connector as claimed in claim 11, wherein said mounting portions are located by two lateral sides of the shield.

13. A receptacle connector comprising:
a terminal module defining a rear base, a mating tongue extending forwards from the rear base and a cable supporting portion extending rearwards from the rear base, the mating tongue defining a root portion near to the rear base and the root portion being thicker than a front portion of the mating tongue;
two rows of contacts comprising contacting sections located upon opposite surface of the mating tongue and tails located upon the cable supporting portion;
a capsular metallic shield surrounding the terminal module and the mating tongue extending into metallic shield;
a plurality of micro-coaxial cables located behind the terminal module and comprising inner conductors disposed upon the cable supporting portion and soldered with the tails of the contacts.

14. The receptacle connector as claimed in claim 13, comprising a silicon inner seal, wherein the inner seal covers the rear base of the terminal module to seal a gap between the metallic shield and the terminal module.

15. The receptacle connector as claimed in claim 13, comprising a rubber or silicon outer seal, wherein the outer seal is located upon a circumferential exterior surface of the capsular metallic shield around a front edge region thereof.

16. The receptacle connector as claimed in claim 13, comprising a grounding bar, wherein the grounding bar is essentially exposed upon two opposite surfaces of the cable supporting portion, the grounding bar are welded directly with braiding layers of the corresponding wire, respectively.

17. The receptacle connector as claimed in claim 13, further comprising a metallic bracket secured with the metallic shield, wherein the metallic bracket defines a rear wall with a window through which the micro-coaxial cables extend.

18. The receptacle connector as claimed in claim 8, further including a metallic shielding plate embedded within the mating tongue with legs extending downwardly for mounting to the printed circuit board, said shielding plate forming a pair of locking notches in two opposite lateral sides of the mating tongue for engagement with a pair of locking heads of a latch of a complementary plug connector.

19. The receptacle connector as claimed in claim 18, wherein said shielding plate includes a pair of legs mechanically and electrically connected to the metallic shield.

20. The receptacle connector as claimed in claim 13, further including a metallic shielding plate embedded within the mating tongue with two opposite side locking notches exposed to the mating tongue.

* * * * *